(12) United States Patent
Lin

(10) Patent No.: US 9,978,700 B2
(45) Date of Patent: May 22, 2018

(54) METHOD FOR BUILDING UP A FAN-OUT RDL STRUCTURE WITH FINE PITCH LINE-WIDTH AND LINE-SPACING

(71) Applicant: STATS ChipPAC, Ltd., Singapore (SG)

(72) Inventor: Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 117 days.

(21) Appl. No.: 14/305,640

(22) Filed: Jun. 16, 2014

(65) Prior Publication Data
US 2015/0364394 A1 Dec. 17, 2015

(51) Int. Cl.
*H01L 23/31* (2006.01)
*H01L 21/56* (2006.01)
*H01L 23/00* (2006.01)

(52) U.S. Cl.
CPC ............ *H01L 24/03* (2013.01); *H01L 21/568* (2013.01); *H01L 24/19* (2013.01); *H01L 24/20* (2013.01); *H01L 24/96* (2013.01); *H01L 24/97* (2013.01); *H01L 21/561* (2013.01); *H01L 23/315* (2013.01); *H01L 23/3128* (2013.01); *H01L 23/3135* (2013.01); *H01L 2221/101* (2013.01); *H01L 2224/04105* (2013.01); *H01L 2224/12105* (2013.01); *H01L 2224/94* (2013.01); *H01L 2924/13091* (2013.01); *H01L 2924/18162* (2013.01); *H01L 2924/3511* (2013.01)

(58) Field of Classification Search
CPC ...... H01L 23/315; H01L 21/56; H01L 23/481
See application file for complete search history.

(56) References Cited

U.S. PATENT DOCUMENTS

| | | | | |
|---|---|---|---|---|
| 5,614,765 | A | * | 3/1997 | Avanzino .......... H01L 21/76807 257/763 |
| 5,929,524 | A | * | 7/1999 | Drynan ............. H01L 21/76816 257/758 |
| 7,666,779 | B2 | * | 2/2010 | Ke .......................... H01L 24/11 257/E21.508 |
| 2004/0219717 | A1 | * | 11/2004 | Takahashi ........... H01L 23/3107 438/108 |
| 2008/0135977 | A1 | * | 6/2008 | Meyer .................... H01L 24/82 257/531 |

(Continued)

*Primary Examiner* — Mark Tornow
*Assistant Examiner* — Abbigale Boyle
(74) *Attorney, Agent, or Firm* — Brian M. Kaufman; Robert D. Atkins; Atkins and Associates, P.C.

(57) ABSTRACT

A semiconductor device has a semiconductor die and an encapsulant deposited over the semiconductor die. A first insulating layer is formed over a first surface of the encapsulant and an active surface of the semiconductor die. A second insulating layer is formed over a second surface of the encapsulant opposite the first surface. A conductive layer is formed over the first insulating layer. The conductive layer includes a line-pitch or line-spacing of less than 5 μm. The active surface of the semiconductor die is recessed within the encapsulant. A third insulating layer is formed over the semiconductor die including a surface of the third insulating layer coplanar with a surface of the encapsulant. The second insulating layer is formed prior to forming the conductive layer. A trench is formed in the first insulating layer. The conductive layer is formed within the trench.

25 Claims, 19 Drawing Sheets

(56) References Cited

U.S. PATENT DOCUMENTS

| | | | |
|---|---|---|---|
| 2008/0143379 A1* | 6/2008 | Norman | H01L 23/50 |
| | | | 326/39 |
| 2009/0152715 A1* | 6/2009 | Shim | H01L 21/568 |
| | | | 257/737 |
| 2009/0196011 A1* | 8/2009 | Kobayashi | H01L 23/3114 |
| | | | 361/820 |
| 2010/0006330 A1* | 1/2010 | Fu | H01L 21/486 |
| | | | 174/260 |
| 2010/0133704 A1* | 6/2010 | Marimuthu | H01L 21/565 |
| | | | 257/778 |
| 2011/0221055 A1* | 9/2011 | Lin | H01L 21/563 |
| | | | 257/692 |
| 2012/0001325 A1 | 1/2012 | Lin et al. | |
| 2012/0108013 A1 | 5/2012 | Fujisawa et al. | |
| 2012/0112340 A1* | 5/2012 | Lin | H01L 21/568 |
| | | | 257/734 |
| 2013/0062760 A1* | 3/2013 | Hung | H01L 21/561 |
| | | | 257/738 |
| 2013/0075936 A1* | 3/2013 | Lin | H01L 24/19 |
| | | | 257/777 |
| 2013/0168848 A1* | 7/2013 | Lin | H01L 24/19 |
| | | | 257/737 |
| 2013/0241048 A1 | 9/2013 | Lin et al. | |
| 2013/0273731 A1 | 10/2013 | Gulpen et al. | |

* cited by examiner

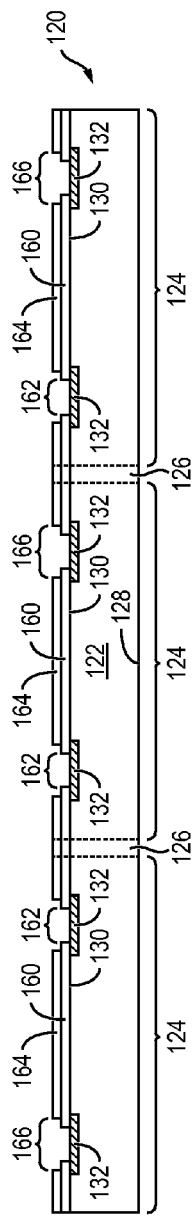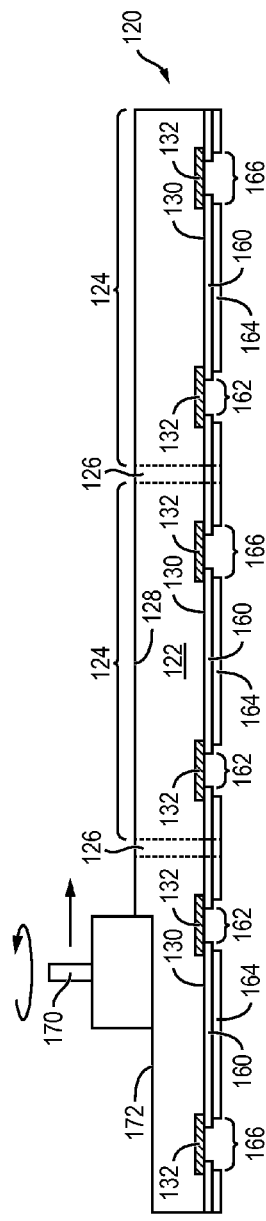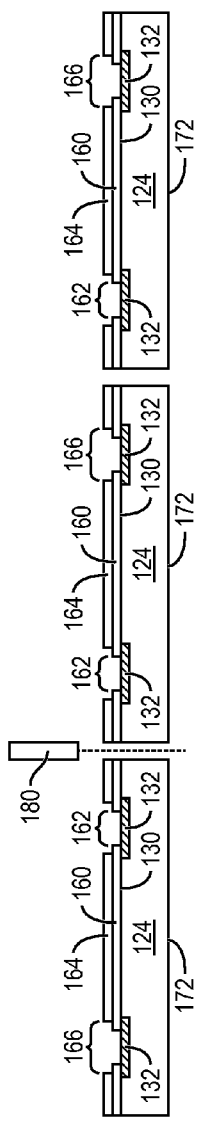

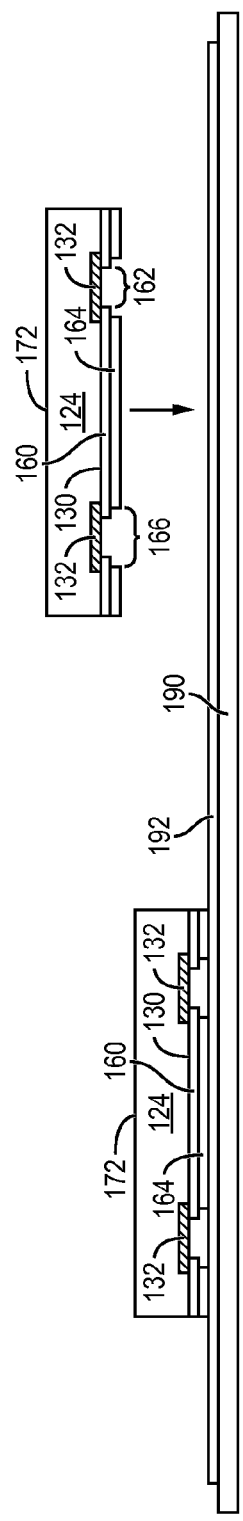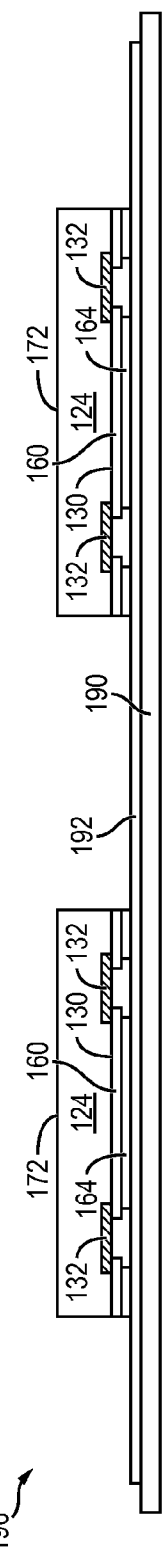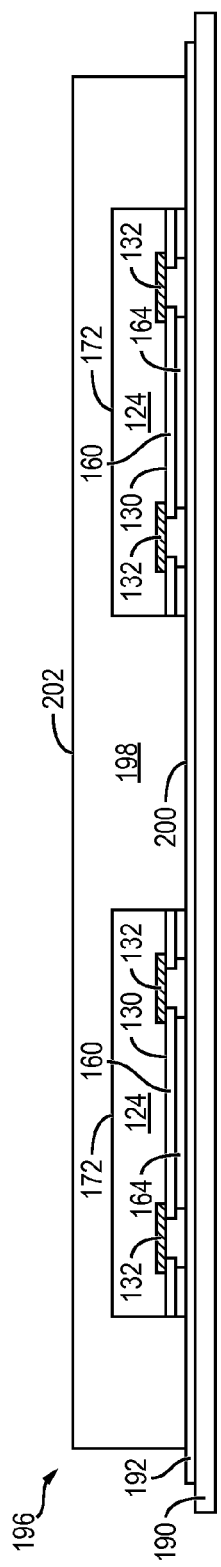

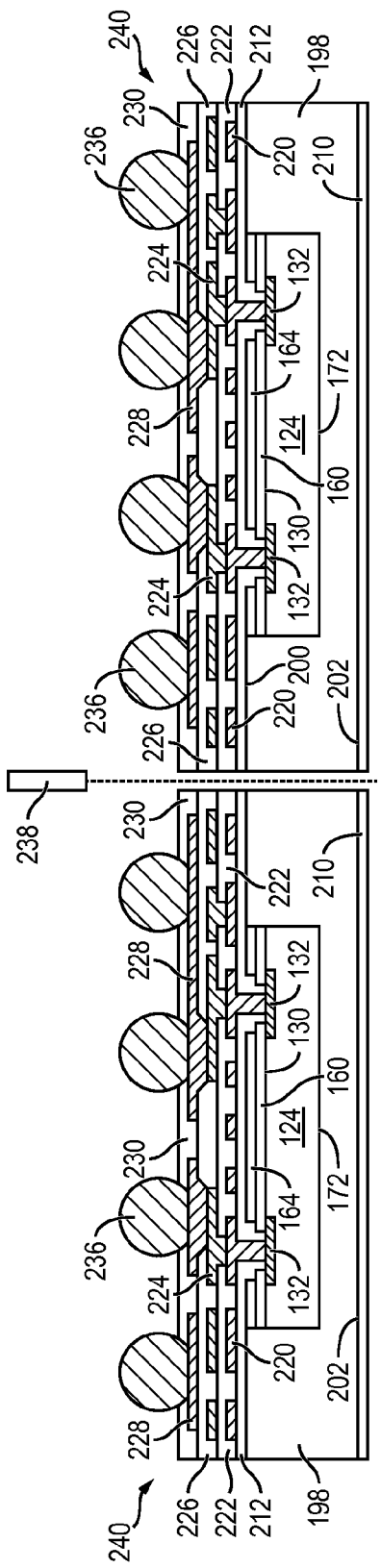
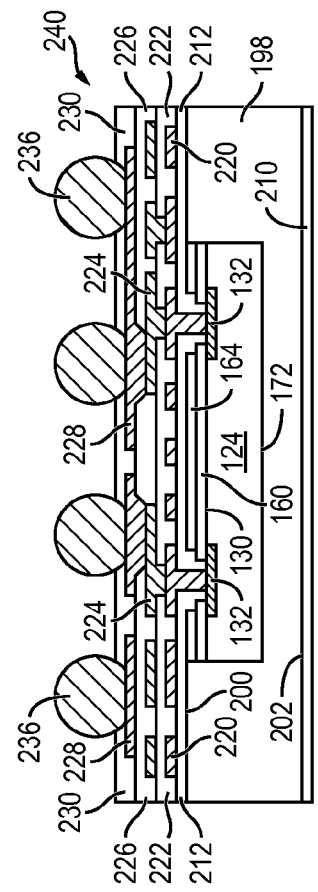
FIG. 3o
FIG. 4

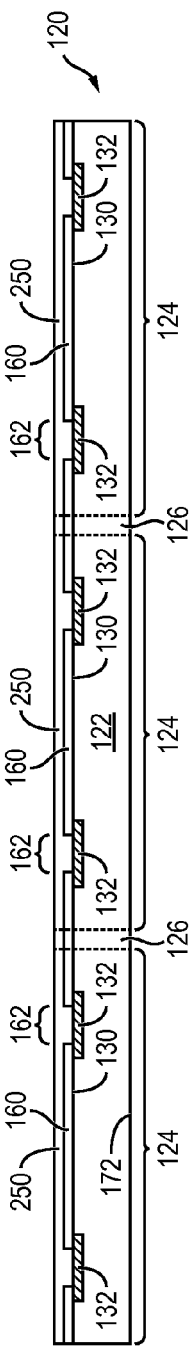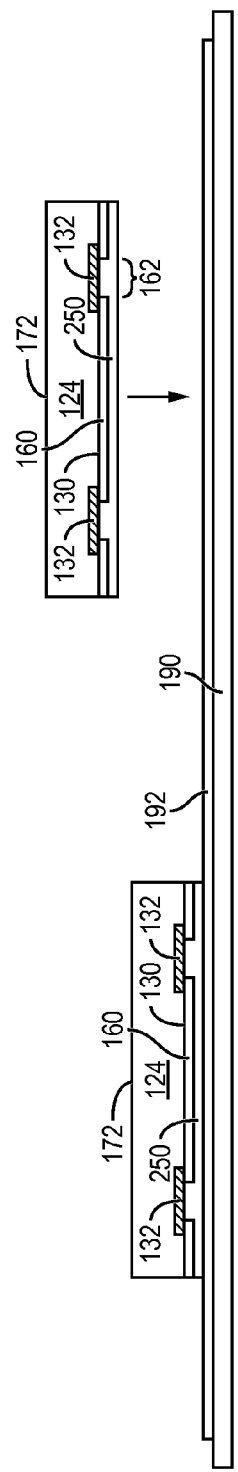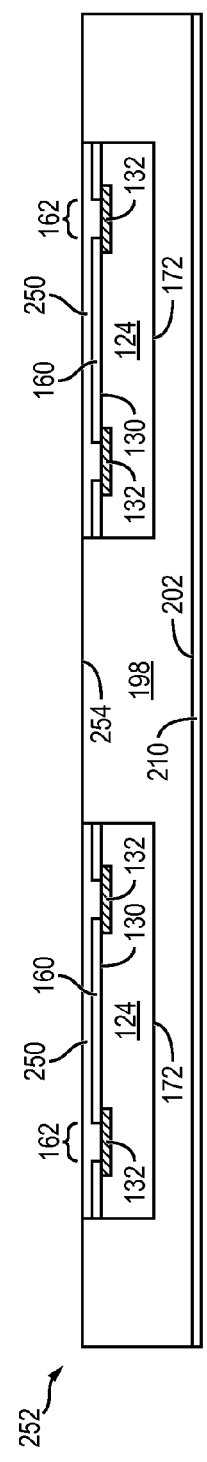
FIG. 5a
FIG. 5b
FIG. 5c

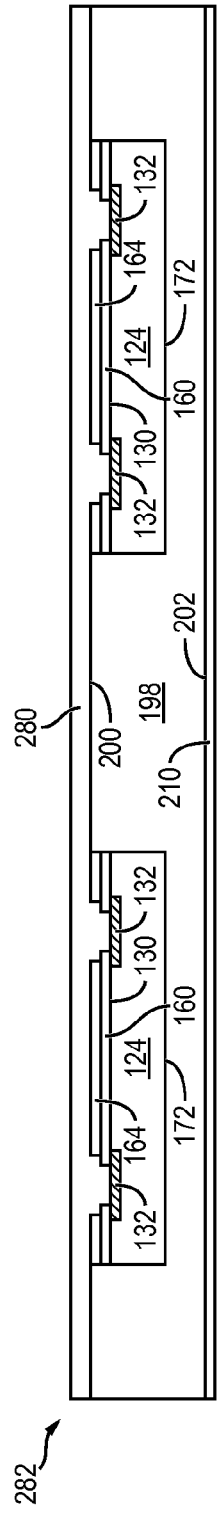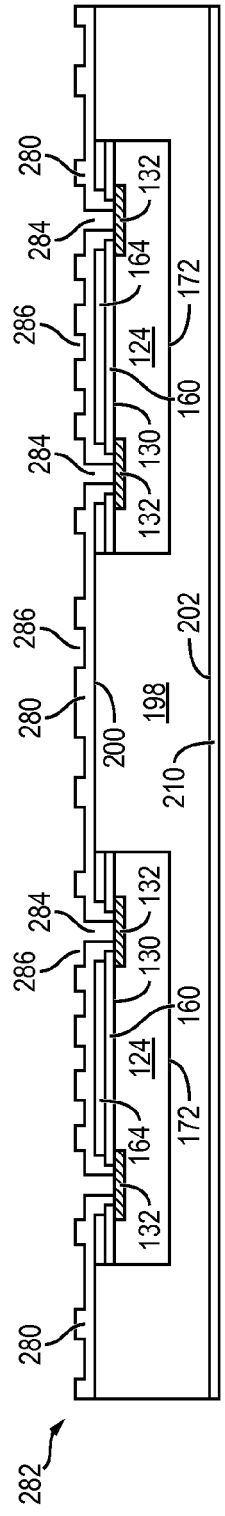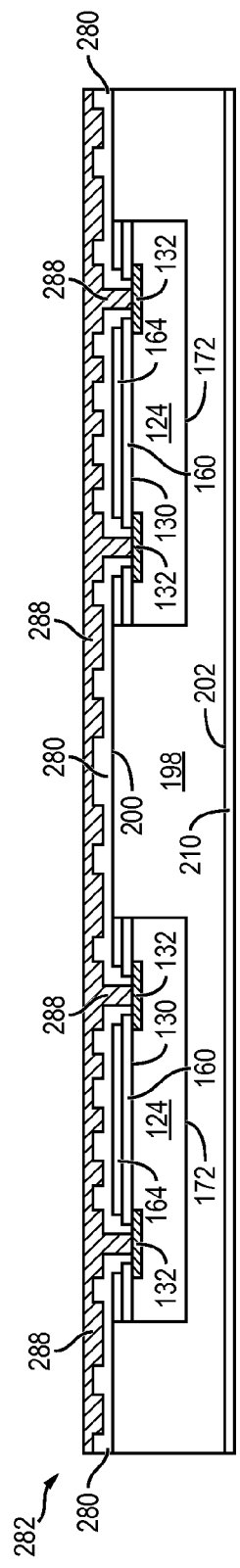

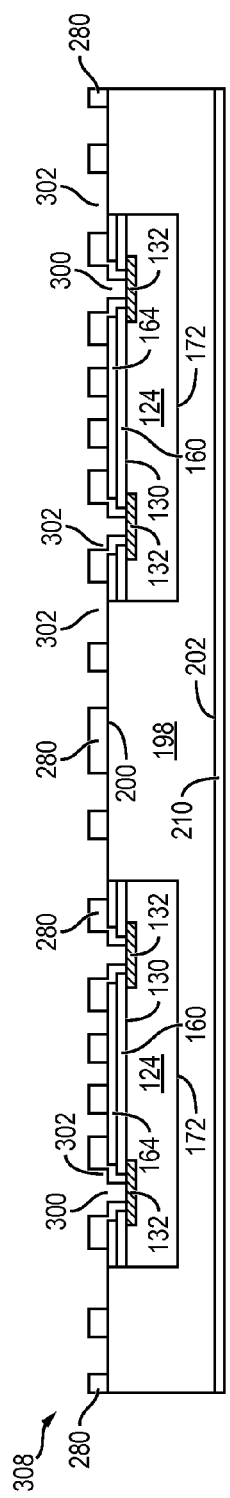
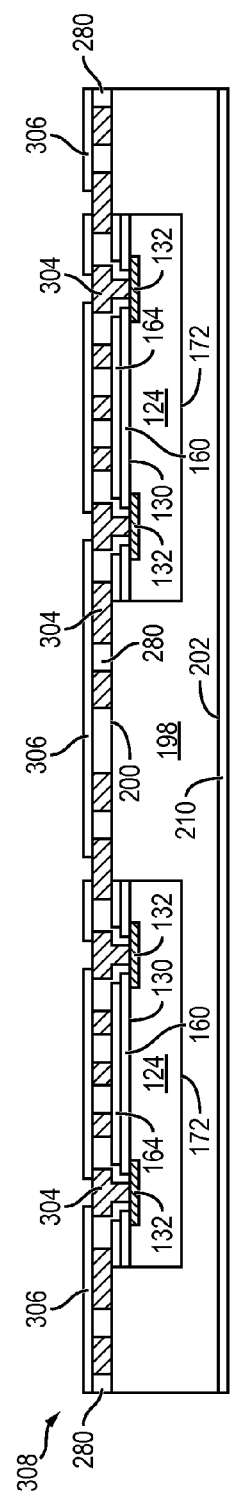
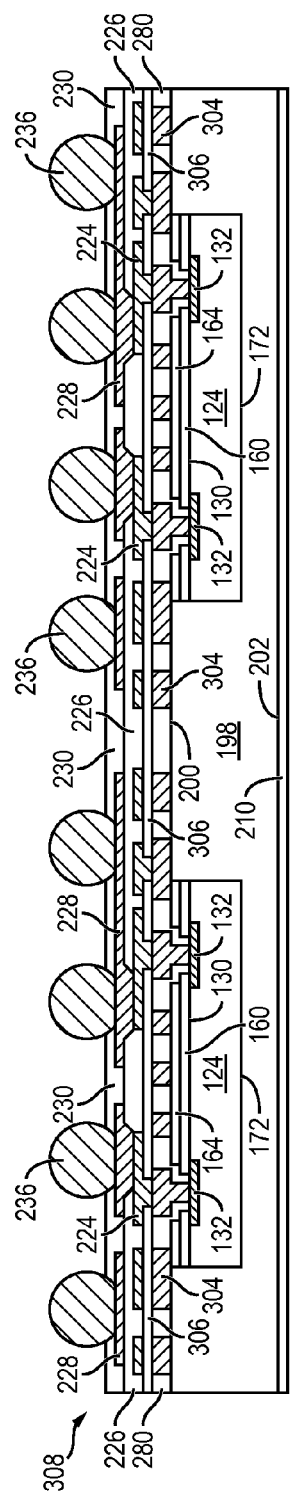
FIG. 9a
FIG. 9b
FIG. 9c

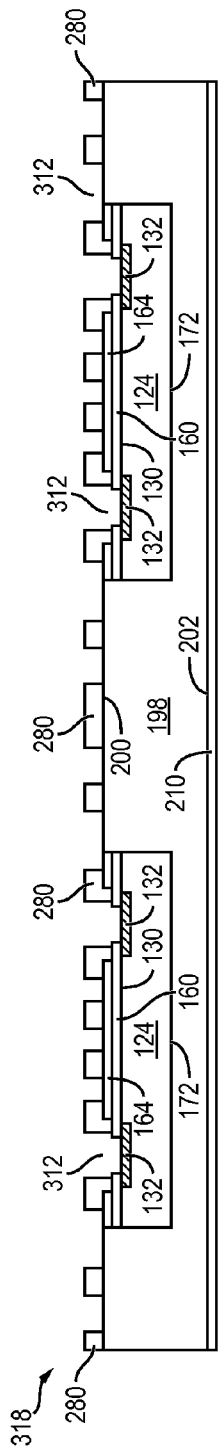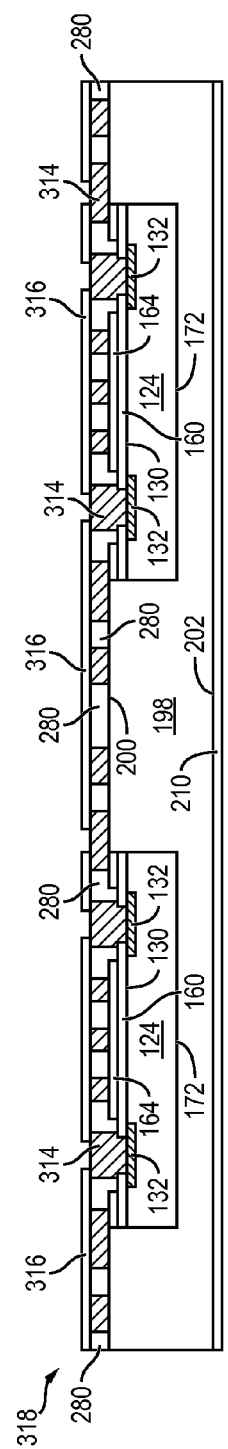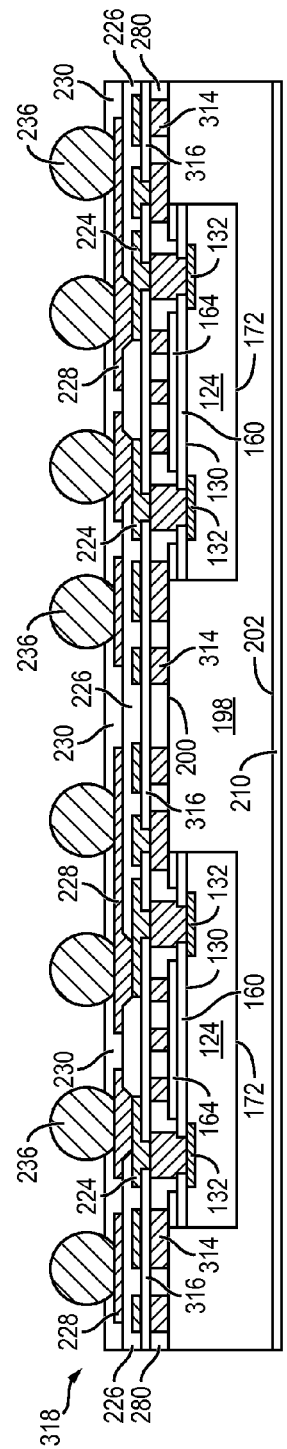

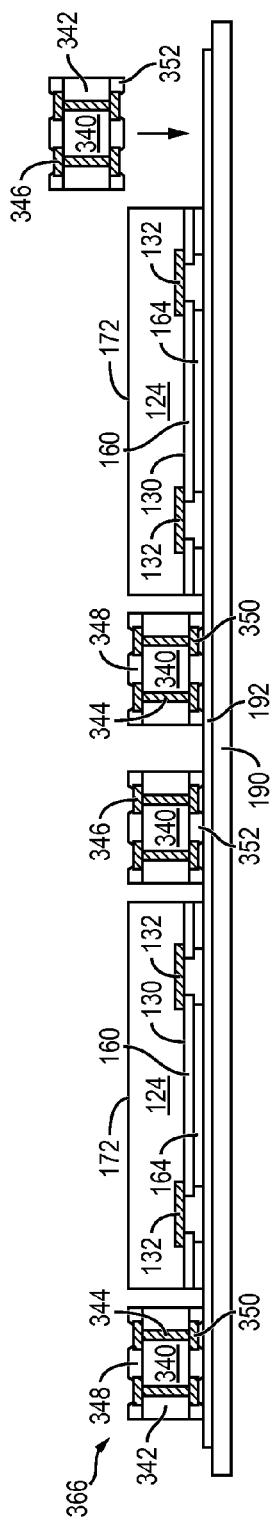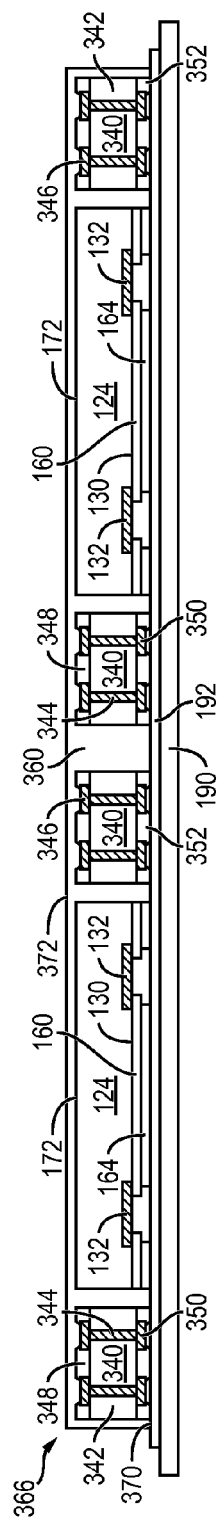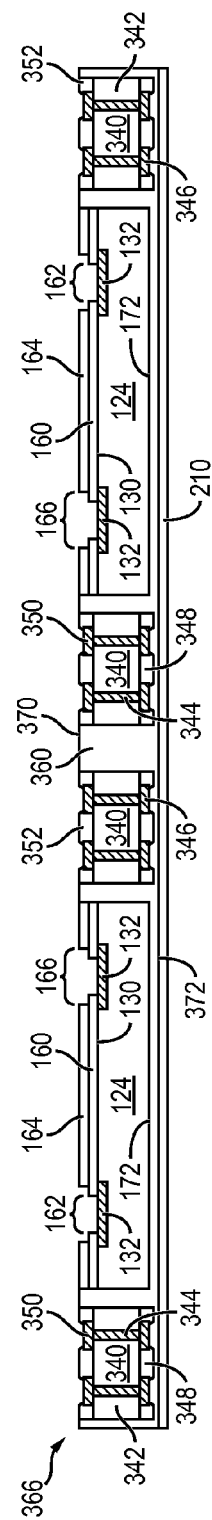

METHOD FOR BUILDING UP A FAN-OUT RDL STRUCTURE WITH FINE PITCH LINE-WIDTH AND LINE-SPACING

FIELD OF THE INVENTION

The present invention relates in general to semiconductor devices and, more particularly, to a method of building up a fan-out redistribution layer (RDL) structure with a line-width or line-spacing less than 5 micrometers (μm).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

As semiconductor die become smaller, a finer pitch of electrical interconnection is required to connect to the semiconductor die. The pitch of an electrical interconnection to a semiconductor die can be made smaller by reducing the width of an interconnect (line-width), by reducing the space between adjacent interconnects (line-spacing), or by reducing both the line-width and line-spacing. As line-width and line-spacing reach the 5 μm mark and below, yield loss becomes a major challenge. Many environmental factors which do not affect yield with a higher pitch interconnection will cause defects with line-width or line-spacing of less than 5 μm, which reduces yield.

A semiconductor die is typically encapsulated and an interconnect structure is formed over the die and encapsulant. The encapsulant will commonly generate particles during handling and subsequent processing steps. With a larger pitch interconnection, the particles generated from the encapsulant are not a problem. As line-width and line-spacing are reduced to 5 μm or below, the particle fall-out from encapsulant handling becomes a significant factor in yield reduction.

SUMMARY OF THE INVENTION

A need exists for improved yield when packaging semiconductor die using sub 5 μm line-width or line-spacing interconnect structures. Accordingly, in one embodiment, the present invention is a method of making a semiconductor device comprising the steps of providing a semiconductor die, depositing an encapsulant over the semiconductor die, forming a first insulating layer over a first surface of the encapsulant and an active surface of the semiconductor die, forming a second insulating layer over a second surface of the encapsulant opposite the first surface, and forming a conductive layer over the first insulating layer.

In another embodiment, the present invention is a method of making a semiconductor device comprising the steps of providing a semiconductor die, depositing an encapsulant over the semiconductor die, forming a first insulating layer over a first surface of the encapsulant, forming a second insulating layer over a second surface of the encapsulant, and forming a conductive layer over the first insulating layer.

In another embodiment, the present invention is a method of making a semiconductor device comprising the steps of providing a semiconductor die, depositing an encapsulant over the semiconductor die, forming a first insulating layer over a first surface of the encapsulant, and forming a second insulating layer over a second surface of the encapsulant.

In another embodiment, the present invention is a semiconductor device comprising a semiconductor die. An encapsulant is deposited over the semiconductor die. A first insulating layer is formed over a first surface of the encapsulant. A second insulating layer is formed over a second surface of the encapsulant.

BRIEF DESCRIPTION OF THE DRAWINGS

FIGS. 2a-2f illustrate a semiconductor wafer with a plurality of semiconductor die separated by a saw street;

FIG. 4 illustrates a singulated eWLB formed in accordance with FIGS. 3a-3o;

FIGS. 5a-5d illustrate a first alternative embodiment for forming a reconstituted wafer with a semiconductor die recessed in a cavity of the reconstituted wafer;

FIGS. 8a-8f illustrate a first alternative embodiment for forming an RDL layer with fine pitch line-width or line-spacing;

FIGS. 9a-9c illustrate a second alternative embodiment for forming an RDL layer with fine pitch line-width or line-spacing;

FIGS. 10a-10c illustrate a third alternative embodiment for forming an RDL layer with fine pitch line-width or line-spacing;

FIGS. 15a-15e illustrate forming an eWLB with 3D interconnect components embedded in the reconstituted wafer.

DETAILED DESCRIPTION OF THE DRAWINGS

Figure 1:
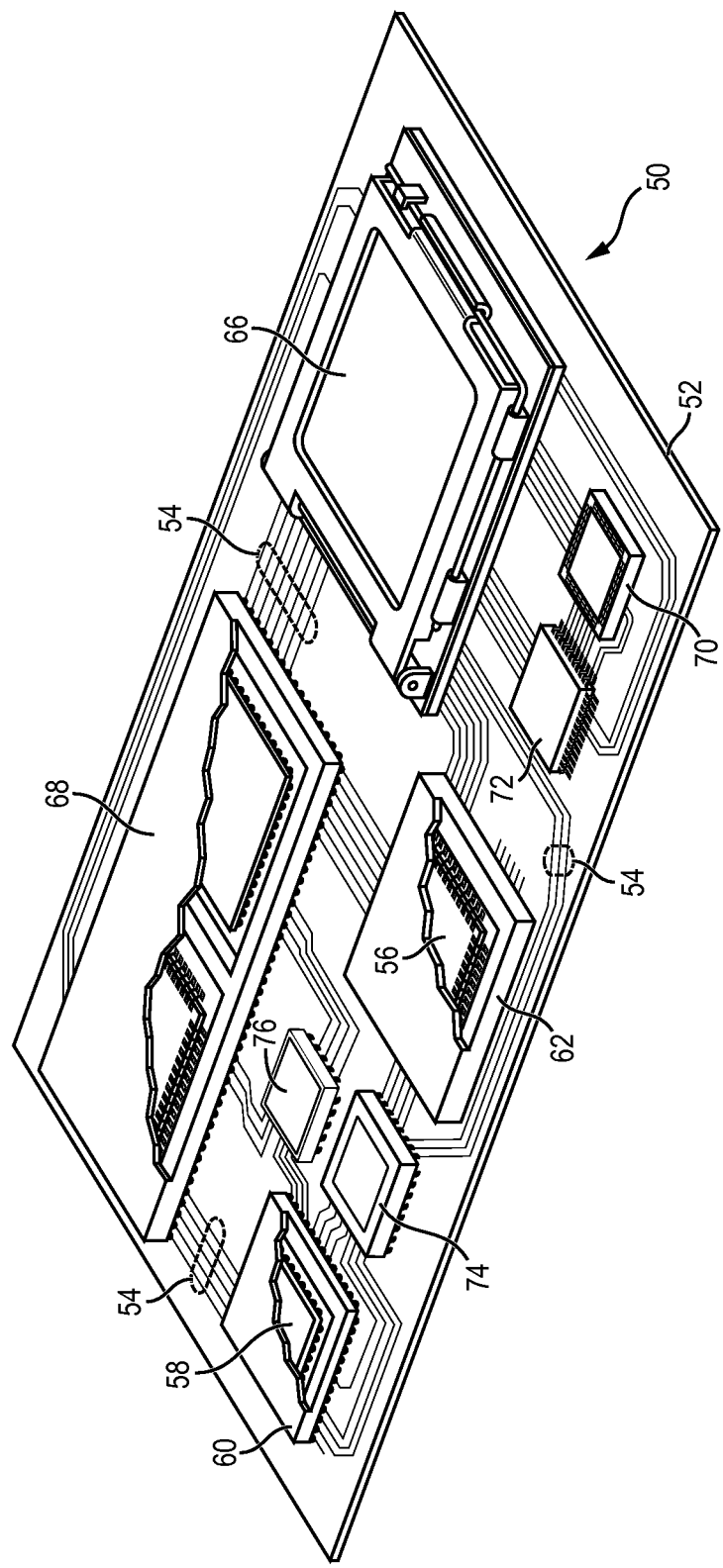
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
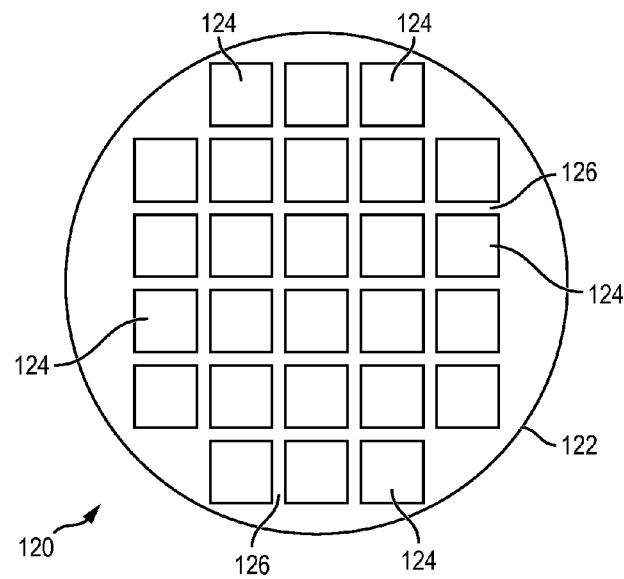

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
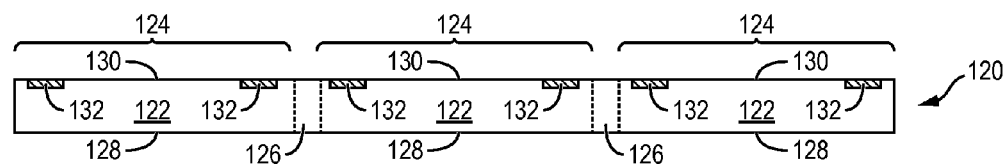

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
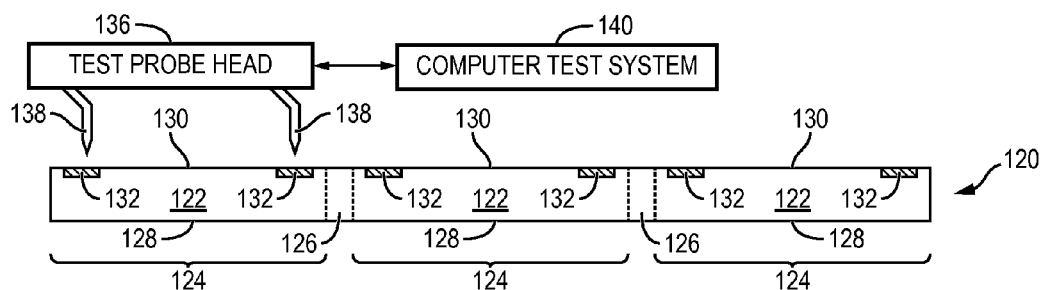

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 134 on each semiconductor die 124 and provide electrical stimuli to contact pads 132. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, insulating or passivation layer 160 is formed over active surface 130 of semiconductor wafer 120. Insulating layer 160 is formed using PVD, CVD, printing, lamination, spin coating or spray coating. Insulating layer 160 contains one or more layers of silicon dioxide (SiO2), silicon nitride (Si3N4), silicon oxynitride (SiON), tantalum pentoxide (Ta2O5), aluminum oxide (Al2O3), solder resist, or other material having similar insulating and structural properties. A portion of insulating layer 160 is removed by etching or LDA to form opening 162 and expose conductive layer 132.

Insulating layer or passivation layer 164 is formed over insulating layer 160 and semiconductor wafer 120 using PVD, CVD, printing, spin coating, spray coating, sintering, or thermal oxidation. Insulating layer 164 contains one or more layers of SiO2, Si3N4, SiON, Ta2O5, Al2O3, hafnium oxide (HfO2), benzocyclobutene (BCB), polyimide (PI), polybenzoxazoles (PBO), polymer, or other dielectric material having similar structural and insulating properties.

A portion of insulating layer 164 is removed by LDA, etching, or other suitable process to form openings 166 over conductive layer 132. Openings 166 expose conductive layer 132 of semiconductor die 124 for subsequent electrical interconnect. Each opening 166 in insulating layer 164 is wider than a corresponding opening 162 in insulating layer 160 in at least one direction before semiconductor wafer 120 undergoes dicing. In one embodiment, an individual opening 166 extends outside of a corresponding opening 162 by 3 µm on two opposing sides, and opening 166 is not wider than a corresponding opening 162 on two different opposing sides. FIGS. 3g-3k, described in detail below, illustrate multiple possibilities for the shapes of openings 162 and 166. In some embodiments, an optional protection layer is coated over semiconductor wafer 120, insulating layer 160, and insulating layer 164 before dicing the semiconductor wafer into semiconductor die 124.

In FIG. 2e, semiconductor wafer 120 undergoes a back grinding operation with grinder 170 or other suitable mechanical or etching process to reduce a thickness of the semiconductor wafer. In some embodiments, an optional back grinding tape is applied over insulating layers 160 and 164 before back grinding. The back grinding operation leaves new surface 172 of semiconductor wafer 120 uniform across substantially the entire width of the semiconductor wafer.

In FIG. 2f, semiconductor wafer 120 is singulated through saw street 126 using a saw blade or laser cutting tool 180 into individual semiconductor die 124. The individual semiconductor die 124 can be inspected and electrically tested for identification of KGD post singulation.

FIGS. 3a-3o illustrate, in relation to FIGS. 1 and 2a-2f, a process of encapsulating semiconductor die 124 and forming an RDL with a fine pitch line-width or line-spacing over the semiconductor die. The RDL is designed and processed in a manner which reduces particle creation while handling a subsequent reconstituted wafer. In one embodiment, the line-width and line-spacing of the RDL is less than 5 µm.

FIG. 3a shows a cross-sectional view of a portion of a carrier or temporary substrate 190 containing sacrificial base material such as silicon, polymer, beryllium oxide, glass, or other suitable low-cost, rigid material for structural support. An interface layer or double-sided tape 192 is formed over carrier 190 as a temporary adhesive bonding film, etch-stop layer, or thermal release layer.

Carrier 190 can be a round or rectangular panel (greater than 300 mm) with capacity for multiple semiconductor die 124. Carrier 190 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 190 is selected independent of the size of semiconductor die 124 or size of semiconductor wafer 120. That is, carrier 190 has a fixed or standardized size, which can accommodate various size semiconductor die 124 singulated from one or more semiconductor wafers 120. In one embodiment, carrier 190 is circular with a diameter of 330 mm. In another embodiment, carrier 190 is rectangular with a width of 560 mm and length of 600 mm. Semiconductor die 124 may have dimensions of 10 mm by 10 mm, which are placed on the standardized carrier 190. Alternatively, semiconductor die 124 may have dimensions of 20 mm by 20 mm, which are placed on the same standardized carrier 190. Accordingly, standardized carrier 190 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 190 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Semiconductor die 124 from FIG. 2f are mounted to carrier 190 and interface layer 192 using, for example, a pick and place operation with active surface 130 oriented toward the carrier. In one embodiment, semiconductor die 124 are mounted on carrier 190 with active surface 130 oriented away from the carrier. FIG. 3b shows semiconductor die 124 mounted to interface layer 192 of carrier 190 as reconstituted or reconfigured wafer 196.

Reconstituted wafer 196 can be processed into many types of semiconductor packages, including eWLB, fan-in WLCSP, reconstituted or embedded wafer level chip scale packages (eWLCSP), fan-out WLCSP, flipchip packages, three dimensional (3D) packages, package-on-package (PoP), or other semiconductor packages. Reconstituted wafer 196 is configured according to the specifications of the resulting semiconductor package. In one embodiment, semiconductor die 124 are placed on carrier 190 in a high-density arrangement, i.e., 300 µm apart or less, for processing fan-in devices. In another embodiment, semiconductor die 124 are separated by a distance of 50 µm on carrier 190. The distance between semiconductor die 124 on carrier 190 is optimized for manufacturing the semiconductor packages at the lowest unit cost. The larger surface area of carrier 190 accommodates more semiconductor die 124 and lowers manufacturing cost as more semiconductor die 124 are processed per reconstituted wafer 196. The number of semiconductor die 124 mounted to carrier 190 can be greater than the number of semiconductor die 124 singulated from semiconductor wafer 120. Carrier 190 and reconstituted wafer 196 provide the flexibility to manufacture many different types of semiconductor packages using different size semiconductor die 124 from different sized semiconductor wafers 120.

In FIG. 3c, an encapsulant or molding compound 198 is deposited over semiconductor die 124 and carrier 190 as an insulating material using a paste printing, compressive molding, transfer molding, liquid encapsulant molding, vacuum lamination, spin coating, or other suitable applicator. In particular, encapsulant 198 covers the side surfaces and surface 172 of semiconductor die 124. Encapsulant 198 can be polymer composite material, such as epoxy resin with filler, epoxy acrylate with filler, or polymer with proper filler. Encapsulant 198 is non-conductive and environmentally protects the semiconductor device from external elements and contaminants. Encapsulant 198 also protects semiconductor die 124 from degradation due to exposure to light.

Figure 3D:
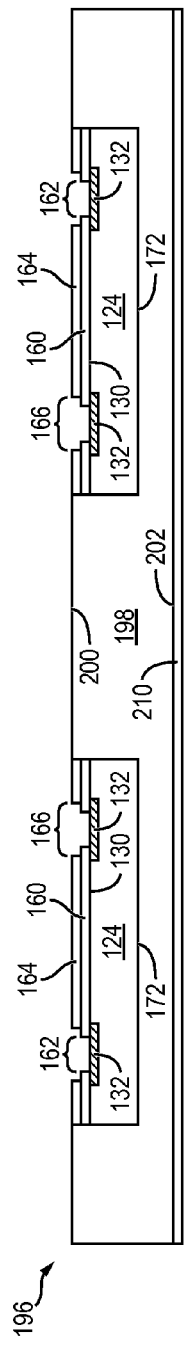
FIGS. 3a-3o illustrate a method of forming an RDL with fine pitch line-width or line-spacing over a reconstituted wafer.

In FIG. 3d, carrier 190 and interface layer 192 are removed by chemical etching, mechanical peeling, chemical mechanical planarization (CMP), mechanical grinding, thermal bake, UV light, laser scanning, or wet stripping to expose insulating layer 164, insulating layer 160, and conductive layer 132. Surface 172 of semiconductor die 124, as well as the sides of the semiconductor die, remain covered by encapsulant 198 as a protective panel to increase yield, particularly when surface mounting the semiconductor die. After carrier 190 and interface layer 192 are removed, an optional edge rounding process is performed on reconstituted wafer 196. An optional back grinding process is performed on encapsulant 198 to tune the warpage of reconstituted wafer 196 and provide a more uniform thickness of the reconstituted wafer. The optional back grinding process is done with back grinding tape or without back grinding tape.

Next, backside layer 210 is formed over surface 202 of reconstituted wafer 196 using PVD, CVD, printing, lamination, spin coating, bonding, or spray coating. Backside layer 210 is a particle prevention layer, and contains one or more layers of SiO2, Si3N4, SiON, Ta2O5, Al2O3, polymer thin film, cured polymer without filler, metal thin film or foil, Si, or other material which will function to reduce particle generation from surface 202 during subsequent processing steps of reconstituted wafer 196. A material with a higher resistance to wear than encapsulant 198 is used for backside layer 210 so that backside layer 210 generates fewer particles than encapsulant 198 would without backside layer 210. The presence of backside layer 210 reduces the amount of particles generated from encapsulant 198 during subsequent processing steps of reconstituted wafer 196.

Reconstituted wafer 196 undergoes a grinding or polishing operation on surface 200 using a grinder or other suitable mechanical or etching process. In some embodiments, an optional back grinding tape is applied over surface 202 and backside layer 210 during the grinding or polishing operation. The grinding operation partially removes insulating layer 164. In some embodiments where a higher quality polishing is required, an additional slurry polishing is performed on surface 200 of reconstituted wafer 196. Insulating layer 164 acts as a partial planarization layer and a polishing stop layer. A portion of insulating layer 164 remains over insulating layer 160 after the grinding operation. A surface of encapsulant 198 is coplanar with a surface of insulating layer 164. Insulating layer 160 is recessed within reconstituted wafer 196. A cavity embedded die approach is used, which results in active surface 130 of semiconductor die 124 being recessed within reconstituted wafer 196. Active surface 130 is protected during subsequent processing steps by being offset relative to surface 200, and covered by insulating layers 160 and 164. While one embodiment for providing for a cavity embedded die approach is illustrated in FIGS. 2d-2f and 3a-3d, any of the embodiments described below, and illustrated in FIGS. 5a-5d, 6a-6d, or 7, can be used interchangeably.

Figure 3E:
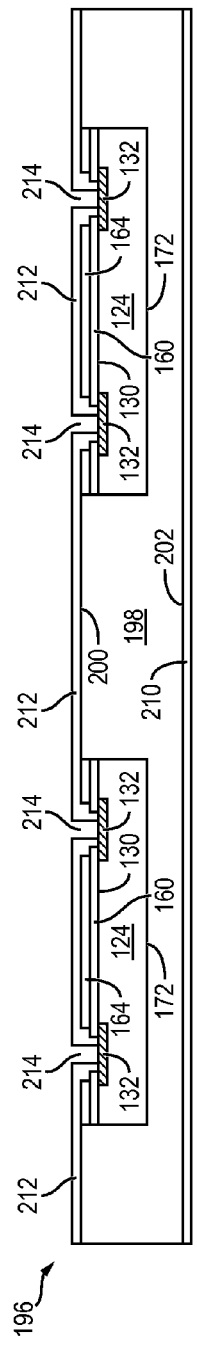

In FIG. 3e, an insulating or passivation layer 212 is formed over surface 200 of reconstituted wafer 196 using PVD, CVD, screen printing, spin coating, spray coating, sintering or thermal oxidation. Insulating layer 212 contains one or more layers of SiO2, Si3N4, SiON, Ta2O5, Al2O3, or other material having similar insulating and structural properties. Insulating layer 212 follows the contour of reconstituted wafer 196. Accordingly, exposed portions of encapsulant 198, insulating layer 164, insulating layer 160, and conductive layer 132 are covered by insulating layer 212. A surface of insulating layer 212 opposite semiconductor die 124 is substantially flat across the width of reconstituted wafer 196. In one embodiment, insulating layer 212 includes an exclusion zone at the edge of reconstituted wafer 196 that is at least 0.5 µm wide. Insulating layer 212 is designed and processed to protect surface 200 of reconstituted wafer 196 and reduce particle creation during wafer handling. Backside layer 210 and insulating layer 212 substantially cover encapsulant 198 at surface 202 and surface 200 of reconstituted wafer 196, respectively. Backside layer 210 and insulating layer 212 reduce particles generated from encapsulant 198 during subsequent processing steps. The effectiveness of backside layer 210 and insulating layer 212 is increased because backside layer 210 and insulating layer 212 are applied as initial steps prior to forming a sub 5 µm line-width or line-spacing interconnect.

A portion of insulating layer 212 is removed by LDA, etching, or other suitable process to form openings or vias 214 over conductive layer 132. In one embodiment, insulating layer 212 is a positive resist, and vias 214 are formed by a single exposure to UV light. Vias 214 expose conductive layer 132 of semiconductor die 124 for subsequent electrical interconnect. In one embodiment, an optional mesh opening is formed in insulating layer 212 between the individual semiconductor die 124.

Figure 3F:
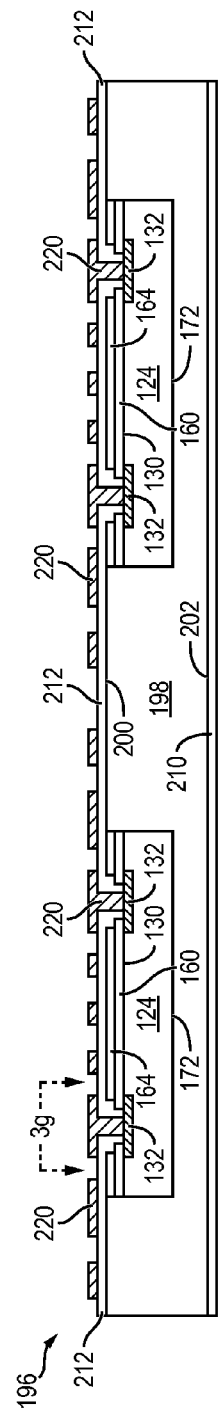

In FIG. 3f, an electrically conductive layer 220 is formed over insulating layer 212 and reconstituted wafer 196 using PVD, CVD, electrolytic plating, electroless plating, or other suitable metal deposition process. Conductive layer 220 contains one or more layers of Al, Cu, Sn, Ni, Au, Ag, or other suitable electrically conductive material. In one embodiment, conductive layer 220 includes an adhesion or seed layer of Titanium (Ti)/Cu, Titanium Tungsten (TiW)/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 220 fills vias 214 and is electrically connected to conductive layer 132. Portions of conductive layer 220 can be electrically common or electrically isolated depending on the design and function of semiconductor die 124 and operate as an RDL to fan-out and extend electrical connection from the semiconductor die. Insulating layer 212 provides for a gap between conductive layer 220 and encapsulant 198.

Figure 3I:
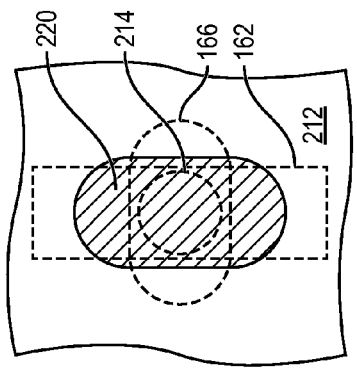
Figure 3H:
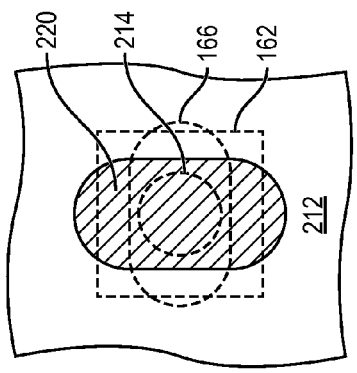
Figure 3G:
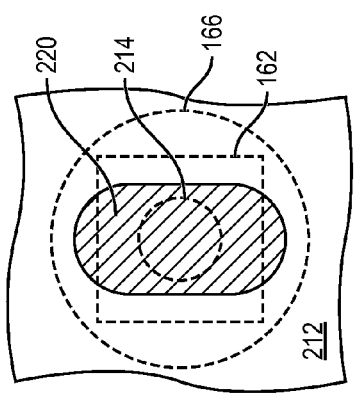

FIGS. 3g-3k illustrate a plan view of reconstituted wafer 196 of FIG. 3f from above conductive layer 132 in a number of possible embodiments. Insulating layer 212 and conductive layer 220 are viewable directly. Opening 162 in insulating layer 160, opening 166 in insulating layer 164, and via 214 in insulating layer 212 are under insulating layer 212 and conductive layer 220, and illustrated as dotted lines. In FIG. 3g, opening 162 in insulating layer 160 is formed as an approximate square over conductive layer 132. Opening 162 is rounded in other embodiments. Opening 166 in insulating layer 164 is formed as an approximate circle around opening 162. Via 214 in insulating layer 212 is formed as a circular column extending through insulating layer 212. Conductive layer 220 is formed in a rounded and elongated shape over via 214, and also fills via 214. Forming conductive layer 220 in an elongated shape provides improved alignment tolerance for the manufacturing process forming conductive layer 220.

FIG. 3h shows opening 162 in insulating layer 160 with a similar square shape as in FIG. 3g. Opening 166 in insulating layer 164 is formed in a rounded and elongated shape, and includes a length in one direction that is longer than a corresponding width of opening 162. Accordingly, opening 166 extends outside of opening 162 on two opposing sides. Via 214 in insulating layer 212 is formed as a circular column extending through insulating layer 212. Conductive layer 220 is formed in a rounded and elongated shape similar to opening 166, and is oriented perpendicular to opening 166.

FIG. 3i shows opening 162 in insulating layer 160 formed in an elongated rectangular shape. Opening 166 in insulating layer 164 is formed in a rounded and elongated shape, similarly to FIG. 3h. Opening 166 extends outside of opening 162 on two opposing sides. Forming openings 162 and 166 elongated in perpendicular directions provides for improved alignment tolerance for the manufacturing process. Via 214 in insulating layer 212 is formed as a circular column extending through insulating layer 212. Conductive layer 220 is formed as a rounded and elongated shape similar to opening 166, and is oriented perpendicular to opening 166.

Figure 3K:
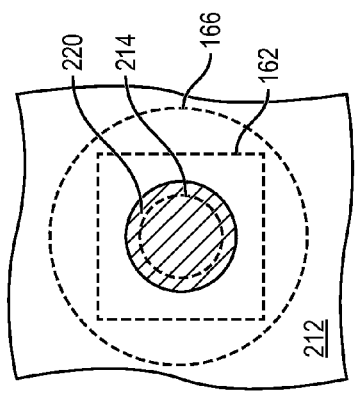
Figure 3J:
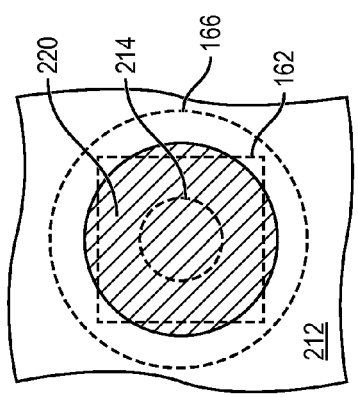

FIG. 3j shows opening 162 in insulating layer 160 with a similar square shape as in FIGS. 3g and 3h. Opening 166 in insulating layer 164 has a similar circular shape as in FIG. 3g. Via 214 in insulating layer 212 is formed as a circular column extending through insulating layer 212. Conductive layer 220 is formed in a circular shape and is large enough to extend outside of opening 162. FIG. 3k is similar to FIG. 3j, but with a smaller conductive layer 220 which does not extend outside of opening 162. Forming a larger conductive layer 220, as in FIG. 3j, provides for a higher alignment tolerance in the manufacturing process. Forming a smaller conductive layer 220, as in FIG. 3k, provides for other traces that are part of conductive layer 220 to have a finer pitch line-width or line-spacing.

Figure 3L:
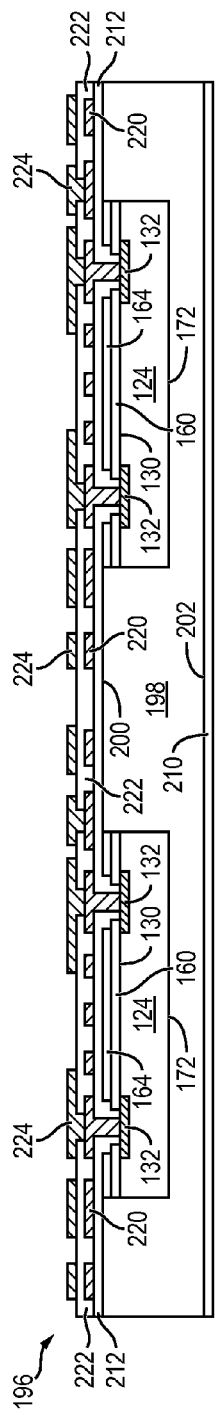

In FIG. 3l, an insulating or passivation layer 222 is formed over insulating layer 212 and conductive layer 220 using PVD, CVD, screen printing, spin coating, spray coating, sintering or thermal oxidation. Insulating layer 222 contains one or more layers of SiO2, Si3N4, SiON, Ta2O5, Al2O3, or other material having similar insulating and structural properties. Insulating layer 222 follows the contour of conductive layer 220. Accordingly, exposed portions of insulating layer 212 and conductive layer 220 are covered by insulating layer 222. Insulating layer 222 includes a surface opposite semiconductor die 124 that is substantially flat across reconstituted wafer 196. In one embodiment, insulating layer 222 includes an exclusion zone at the edge of reconstituted wafer 196 that is at least 0.5 μm wide.

A portion of insulating layer 222 is removed by LDA, etching, or other suitable process to expose conductive layer 220.

An electrically conductive layer 224 is formed over insulating layer 222, and through the openings in insulating layer 222 to contact conductive layer 220, using PVD, CVD, electrolytic plating, electroless plating, or other suitable metal deposition process. Conductive layer 224 can be one or more layers of Al, Cu, Sn, Ni, Au, Ag, or other suitable electrically conductive material. In one embodiment, conductive layer 224 includes an adhesion or seed layer of Ti/Cu, TiW/Cu, or a coupling agent/Cu. Conductive layer 224 is electrically connected to conductive layer 220. Portions of conductive layer 224 can be electrically common or electrically isolated depending on the design and function of semiconductor die 124.

Figure 3M:
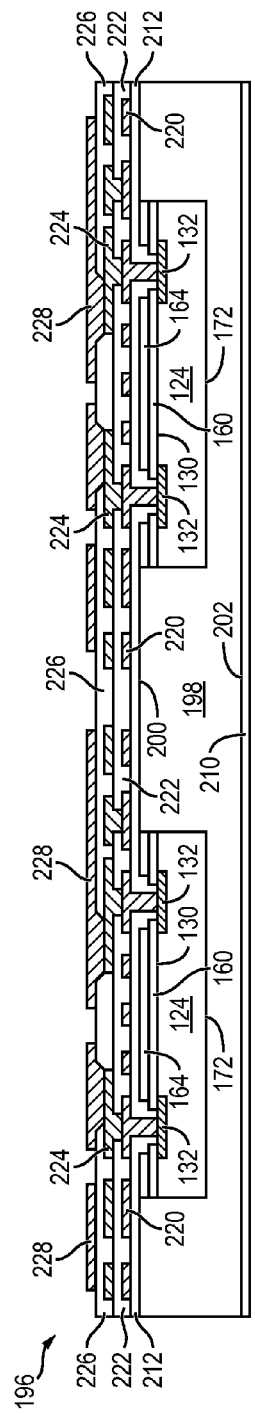

In FIG. 3m, an insulating or passivation layer 226 is formed over insulating layer 222 and conductive layer 224 using PVD, CVD, screen printing, spin coating, spray coating, sintering or thermal oxidation. Insulating layer 226 contains one or more layers of SiO2, Si3N4, SiON, Ta2O5, Al2O3, or other material having similar insulating and structural properties. Insulating layer 226 follows the contour of conductive layer 224. Accordingly, exposed portions of insulating layer 222 and conductive layer 224 are covered by insulating layer 226. Insulating layer 226 includes a surface opposite semiconductor die 124 that is substantially flat across reconstituted wafer 196. In one embodiment, insulating layer 226 includes an exclusion zone at the edge of reconstituted wafer 196 that is at least 0.5 μm wide. A portion of insulating layer 226 is removed by LDA, etching, or other suitable process to expose conductive layer 224.

An optional backside coating or lamination is formed over surface 202 and backside layer 210 using PVD, CVD, printing, lamination, spin coating, spray coating, sintering, or thermal oxidation. The optional backside coating allows further tuning of reconstituted wafer 196 warpage.

An electrically conductive layer 228 is formed over insulating layer 226, and through the openings in insulating layer 226 to contact conductive layer 224, using PVD, CVD, electrolytic plating, electroless plating, or other suitable metal deposition process. Conductive layer 228 can be one or more layers of Al, Cu, Sn, Ni, Au, Ag, or other suitable electrically conductive material. In one embodiment, conductive layer 228 includes an adhesion or seed layer of Ti/Cu, TiW/Cu, or a coupling agent/Cu. Conductive layer 228 is electrically connected to conductive layer 224. Portions of conductive layer 228 can be electrically common or electrically isolated depending on the design and function of semiconductor die 124.

Figure 3N:
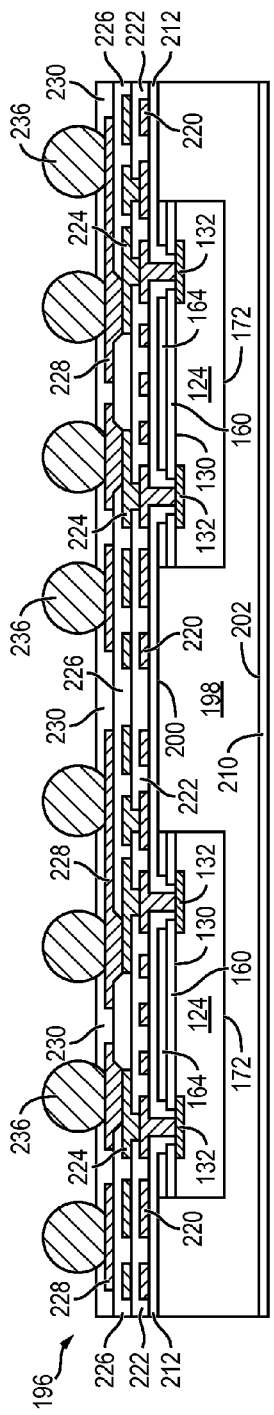

In FIG. 3n, an insulating or passivation layer 230 is formed over insulating layer 226 and conductive layer 228 using PVD, CVD, screen printing, spin coating, spray coating, sintering or thermal oxidation. Insulating layer 230 contains one or more layers of SiO2, Si3N4, SiON, Ta2O5, Al2O3, or other material having similar insulating and structural properties. Insulating layer 230 follows the contour of conductive layer 228. Accordingly, exposed portions of insulating layer 226 and conductive layer 228 are covered by insulating layer 230. Insulating layer 230 includes a surface opposite semiconductor die 124 that is substantially flat across reconstituted wafer 196. An edge bead removal (EBR) process is performed on reconstituted wafer 196 after insulating layer 230 is formed. A portion of insulating layer 230 is removed by LDA, etching, or other suitable process to expose conductive layer 228.

An electrically conductive bump material is deposited over conductive layer 228 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 228 using a suitable attachment or bonding process. In one embodiment, the bump material is reflowed by heating the material above its melting point to form balls or bumps 236. In some applications, bumps 236 are reflowed a second time to improve electrical contact to conductive layer 228. In one embodiment, bumps 236 are formed over an under bump metallization (UBM) layer. Bumps 236 can also be compression bonded or thermocompression bonded to conductive layer 228. Bumps 236 represent one type of interconnect structure that can be formed over conductive layer 228. The interconnect structure can also use bond wires, conductive paste, stud bump, micro bump, or other electrical interconnect.

In FIG. 3o, semiconductor die 124 are singulated through backside layer 210, encapsulant 198, and insulating layers 212, 222, 226, and 230 with saw blade or laser cutting tool 238 into individual eWLB 240. FIG. 4 shows eWLB 240 after singulation. Semiconductor die 124 is electrically connected to conductive layers 220, 224, and 228 and bumps 236 which operate as an RDL structure to fan-out and extend electrical connection from the semiconductor die. Backside layer 210 is a particle prevention layer and covers substantially all of surface 202 of reconstituted wafer 196 prior to forming an RDL layer with sub 5 µm line-width or line-spacing. Insulating layer 212 covers substantially all of surface 200 of reconstituted wafer 196 prior to forming an RDL layer with sub 5 µm line-width or line-spacing. Backside layer 210 and insulating layer 212 reduce particles generated from encapsulant 198, which can cause defects in RDL layers with line-width or line-spacing less than 5 µm. Backside layer 210 also provides a warpage tuning capability for reconstituted wafer 196. An optional additional backside coating allows further tuning of reconstituted wafer 196 warpage.

Openings in insulating layers 160, 164, and 212 are designed to improve alignment tolerance of the openings and conductive layer 220. Portions of conductive layer 220 over conductive layer 132 are designed to improve alignment tolerance of conductive layer 220 while allowing a sub 5 µm line-width or line-spacing for traces of conductive layer 220. A cavity embedded die approach is used, wherein insulating layers 160 and 164 are applied at the semiconductor wafer level. The cavity embedded die approach provides for active surface 130 recessed within reconstituted wafer 196, and active surface 130 covered by insulating layer 160 and 164, to protect semiconductor die 124. The manufacturing process for eWLB 240 provides an improved yield. The eWLB 240 may undergo electrical testing before or after singulation.

Figure 5D:
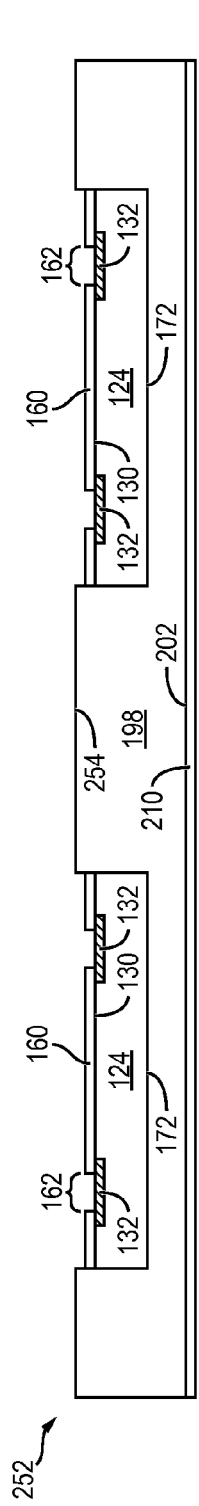

FIGS. 5a-5d illustrate, in relation to FIGS. 2d-2f and 3a-3d, a first alternative embodiment for forming a reconstituted wafer with active surface 130 of semiconductor die 124 recessed within the reconstituted wafer. FIG. 5a illustrates semiconductor wafer 120 with insulating layer 160 formed over active surface 130 as in FIG. 2d. Insulating layer 160 includes openings 162 over conductive layer 132. Temporary protective layer 250 is formed over insulating layer 160 using PVD, CVD, screen printing, spin coating, spray coating, sintering or thermal oxidation. Protective layer 250 contains one or more layers of SiO2, Si3N4, SiON, Ta2O5, Al2O3, or other material having similar insulating and structural properties. Protective layer 250 is formed with a uniform surface opposite semiconductor wafer 120 over substantially the entire width of the semiconductor wafer.

Semiconductor die 124 from FIG. 5a are singulated and, in FIG. 5b, are mounted to carrier 190 and interface layer 192 using, for example, a pick and place operation with active surface 130 oriented toward the carrier. In one embodiment, semiconductor die 124 are mounted on carrier 190 with active surface 130 oriented away from the carrier.

An encapsulant or molding compound 198 is deposited over semiconductor die 124 and carrier 190 as an insulating material using a paste printing, compressive molding, transfer molding, liquid encapsulant molding, vacuum lamination, spin coating, or other suitable applicator. In particular, encapsulant 198 covers the side surfaces and surface 172 of semiconductor die 124. Encapsulant 198 can be polymer composite material, such as epoxy resin with filler, epoxy acrylate with filler, or polymer with proper filler. Encapsulant 198 is non-conductive and environmentally protects the semiconductor device from external elements and contaminants. Encapsulant 198 also protects semiconductor die 124 from degradation due to exposure to light.

Carrier 190 and interface layer 192 are removed by chemical etching, mechanical peeling, CMP, mechanical grinding, thermal bake, UV light, laser scanning, or wet stripping to expose protective layer 250. Surface 172 of semiconductor die 124, as well as the sides of the semiconductor die, remain covered by encapsulant 198 as a protective panel to increase yield, particularly when surface mounting the semiconductor die. FIG. 5c illustrates reconstituted wafer 252 after encapsulant 198 is formed and carrier 190 is removed.

Reconstituted wafer 252 undergoes a grinding or polishing operation on surface 254 using a grinder or other suitable mechanical or etching process. In some embodiments where a higher quality polishing is required, an additional slurry polishing is performed on surface 254 of reconstituted wafer 252. A portion of protective layer 250 remains over insulating layer 160 and conductive layer 132 after the grinding operation. A cavity embedded die approach is used, which results in active surface 130 of semiconductor die 124 being recessed within reconstituted wafer 252. Active surface 130 is protected during subsequent processing steps by being offset from surface 254, and covered by insulating layer 160.

In FIG. 5d, protective layer 250 is removed by LDA, etching, or other suitable process. Backside layer 210 is formed over surface 202 of reconstituted wafer 252 using PVD, CVD, printing, lamination, spin coating, or spray coating. Backside layer 210 is formed before or after protective layer 250 is removed. After protective layer 250 is removed, a build-up RDL structure is formed over reconstituted wafer 252 in accordance with the embodiment in FIGS. 3e-3n, or another embodiment described below. Reconstituted wafer 252 is singulated into individual eWLB.

Figure 6A:
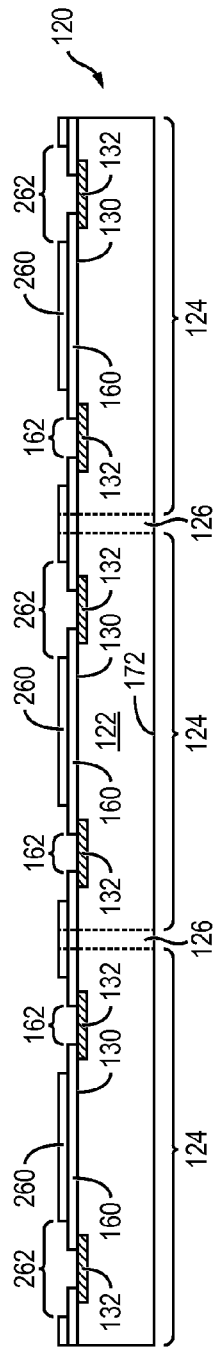
FIGS. 6a-6d illustrate a second alternative embodiment for forming a reconstituted wafer with a semiconductor die recessed in a cavity of the reconstituted wafer.

FIGS. 6a-6d illustrate, in relation to FIGS. 2d-2f and 3a-3d, a second alternative embodiment for forming a reconstituted wafer with active surface 130 of semiconductor die 124 recessed within the reconstituted wafer. FIG. 6a illustrates semiconductor wafer 120 with insulating layer 160 formed over active surface 130 as in FIG. 2d. Insulating layer 160 includes openings 162.

Insulating layer 260 is formed over insulating layer 160 and semiconductor wafer 120 using PVD, CVD, printing, spin coating, spray coating, sintering, or thermal oxidation. Insulating layer 260 contains one or more layers of SiO2, Si3N4, SiON, Ta2O5, Al2O3, HfO2, BCB, PI, PBO, polymer, or other dielectric material having similar structural and insulating properties. Insulating layer 260 is a plating resist layer and also acts as a protection layer on semiconductor die 124.

A portion of insulating layer 260 is removed by LDA, etching, or other suitable process to form openings 262 over conductive layer 132. Openings 262 are shaped similarly to openings 166 in FIGS. 3g-3k.

Figure 6B:
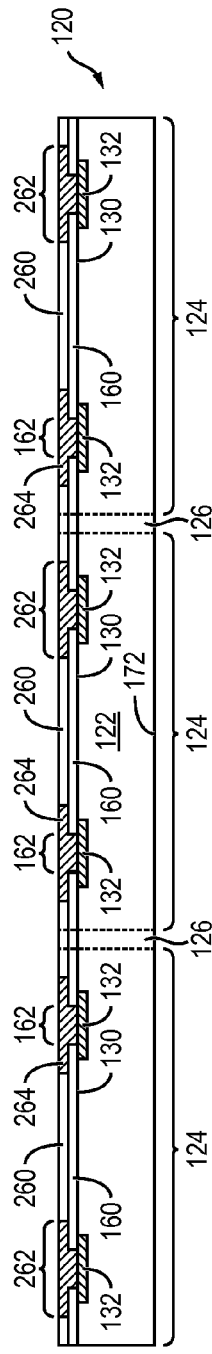

In FIG. 6b, an electrically conductive layer 264 is formed over semiconductor wafer 120 using PVD, CVD, electrolytic plating, electroless plating, or other suitable metal deposition process. Conductive layer 264 contains one or more layers of Al, Cu, Sn, Ni, Au, Ag, or other suitable electrically conductive material. In one embodiment, conductive layer 264 includes an adhesion or seed layer of Ti/Cu, TiW/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 264 substantially fills openings 162 and 262, and is electrically connected to conductive layer 132.

Figure 6C:
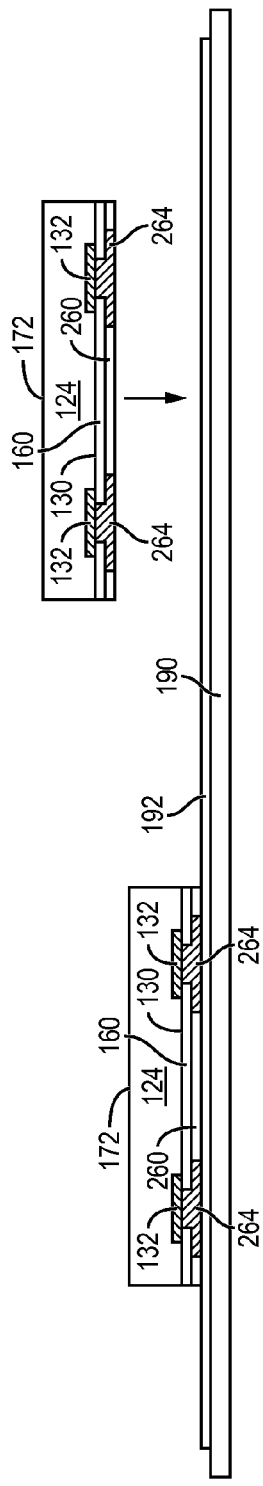

Semiconductor die 124 from FIG. 6b are singulated and, in FIG. 6c, are mounted to carrier 190 and interface layer 192 using, for example, a pick and place operation with active surface 130 oriented toward the carrier. In one embodiment, semiconductor die 124 are mounted on carrier 190 with active surface 130 oriented away from the carrier.

An encapsulant or molding compound 198 is deposited over semiconductor die 124 and carrier 190 as an insulating material using a paste printing, compressive molding, transfer molding, liquid encapsulant molding, vacuum lamination, spin coating, or other suitable applicator. In particular, encapsulant 198 covers the side surfaces and surface 172 of semiconductor die 124. Encapsulant 198 can be polymer composite material, such as epoxy resin with filler, epoxy acrylate with filler, or polymer with proper filler. Encapsulant 198 is non-conductive and environmentally protects the semiconductor device from external elements and contaminants. Encapsulant 198 also protects semiconductor die 124 from degradation due to exposure to light.

Figure 6D:
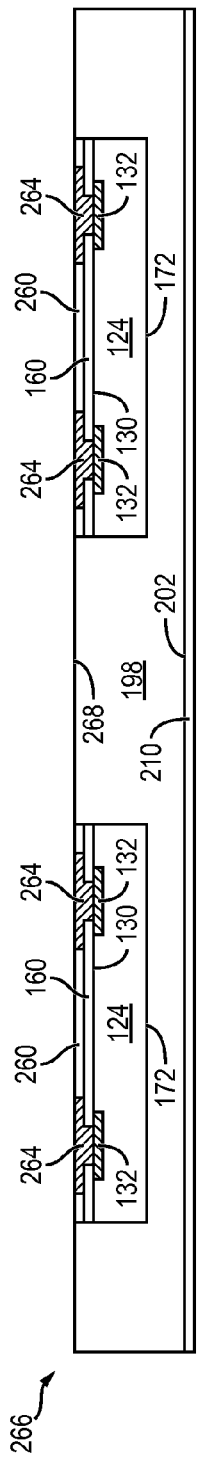

Carrier 190 and interface layer 192 are removed by chemical etching, mechanical peeling, CMP, mechanical grinding, thermal bake, UV light, laser scanning, or wet stripping to expose insulating layer 260 and conductive layer 264. Surface 172 of semiconductor die 124, as well as the sides of the semiconductor die, remain covered by encapsulant 198 as a protective panel to increase yield, particularly when surface mounting the semiconductor die. FIG. 6d illustrates reconstituted wafer 266 after encapsulant 198 is formed and carrier 190 is removed. Backside layer 210 is formed over surface 202 of reconstituted wafer 266 using PVD, CVD, printing, lamination, spin coating, or spray coating.

Reconstituted wafer 266 undergoes a grinding or polishing operation on surface 268 using a grinder or other suitable mechanical or etching process. In some embodiments where a higher quality polishing is required, an additional slurry polishing is performed on surface 268 of reconstituted wafer 266. A portion of insulating layer 260 remains over insulating layer 160 after the grinding operation. A surface of encapsulant 198 is coplanar with a surface of insulating layer 260 and conductive layer 264 to form surface 268 of reconstituted wafer 266. Insulating layer 160 is recessed within reconstituted wafer 266. A cavity embedded die approach is used, which results in active surface 130 of semiconductor die 124 being recessed within reconstituted wafer 266. Active surface 130 is protected during subsequent processing steps by being offset from surface 268, and being covered by insulating layers 160 and 260.

A build-up RDL structure is formed over reconstituted wafer 266 in accordance with the embodiment in FIGS. 3e-3n, or another embodiment described below. Reconstituted wafer 266 is singulated into individual eWLB.

Figure 7:
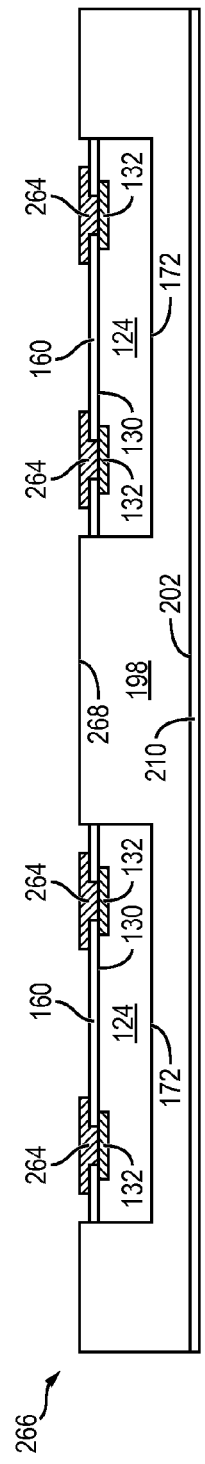
FIG. 7 illustrates a third alternative embodiment for forming a reconstituted wafer with a semiconductor die recessed in a cavity of the reconstituted wafer.

FIG. 7 illustrates, in relation to FIGS. 2d-2f and 3a-3d, a third alternative embodiment for forming a reconstituted wafer with active surface 130 of semiconductor die 124 recessed within the reconstituted wafer. Continuing from FIG. 6d, insulating layer 260 is removed by LDA, etching, or other suitable process. After insulating layer 260 is removed, a build-up RDL structure is formed over reconstituted wafer 266 in accordance with the embodiment in FIGS. 3e-3n, or another embodiment described below. Reconstituted wafer 266 is singulated into individual eWLB.

FIGS. 8a-8f illustrate, in relation to FIGS. 3d-3f, a first alternative embodiment for forming an RDL with line-width or line-spacing less than 5 μm. The low pitch RDL structure described in FIGS. 8a-8f is formed on the embodiment for providing a recessed active surface 130 as shown in FIGS. 2d-2f and 3a-3d. However, the embodiments of FIGS. 5a-5d, FIGS. 6a-6d, or FIG. 7 are also compatible with the RDL layer as formed in FIGS. 8a-8f.

Continuing from FIG. 3d, FIG. 8a illustrates an insulating or passivation layer 280 formed over reconstituted wafer 282 using PVD, CVD, screen printing, spin coating, spray coating, sintering or thermal oxidation. In one embodiment, insulating layer 280 is double coated to provide sufficient thickness for a subsequent damascene process. Insulating layer 280 contains one or more layers of SiO2, Si3N4, SiON, Ta2O5, Al2O3, or other material having similar insulating and structural properties. Insulating layer 280 follows the contour of reconstituted wafer 282. Accordingly, exposed portions of encapsulant 198, insulating layer 164, insulating layer 160, and conductive layer 132 are covered by insulating layer 280. A surface of insulating layer 280 opposite semiconductor die 124 is substantially flat across the width of reconstituted wafer 282. In one embodiment, insulating layer 280 includes an exclusion zone at the edge of reconstituted wafer 282 that is at least 0.5 μm wide. Insulating layer 280 is designed and processed to reduce particles generated from encapsulant 198 during wafer handling.

The first RDL layer, conductive layer 288, is formed using a semi-additive or damascene process. In FIG. 8b, a portion of insulating layer 280 is removed by LDA, etching, or other suitable process to form openings or vias 284 and trenches or RDL pattern 286. In one embodiment, insulating layer 280 is a positive resist with vias 284 formed by a first exposure to UV light and trenches 286 formed by a second exposure to UV light. Vias 284 expose conductive layer 132 of semiconductor die 124 for subsequent electrical interconnect. In one embodiment, trenches 286 are formed using double patterning in order to provide for an RDL layer with a sub-5 μm line-width or line-spacing. Other forms of multiple patterning are used in other embodiments.

In FIG. 8c, an electrically conductive layer 288 is formed in vias 284 and trenches 286 using PVD, CVD, electrolytic plating, electroless plating, or other suitable metal deposition process. Conductive layer 288 contains one or more layers of Al, Cu, Sn, Ni, Au, Ag, or other suitable electrically conductive material. In one embodiment, conductive layer 288 includes an adhesion or seed layer of Ti/Cu, TiW/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 288 overfills vias 284 and trenches 286 so that the conductive material in each via 284 and trench 286 is electrically connected. In one embodiment, conductive layer 288 forms a flat or nearly flat surface over substantially all of reconstituted wafer 282.

Figure 8D:
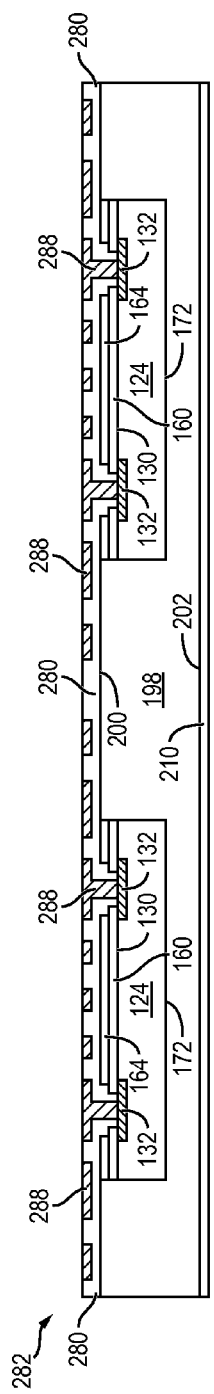

In FIG. 8d, reconstituted wafer 282 undergoes a grinding or polishing operation on conductive layer 288 using a grinder or other suitable mechanical or etching process. The grinding operation removes a portion of conductive layer 288 opposite semiconductor die 124 to expose a portion of insulating layer 280 and electrically isolate individual portions of conductive layer 288. Portions of conductive layer 288 can be electrically common or electrically isolated depending on the design and function of semiconductor die 124, and operate as an RDL to fan-out and extend electrical connection from the semiconductor die. Portions of conductive layer 288 over conductive layer 132 have a similar shape in plan view as conductive layer 220 in FIGS. 3g-3k. Insulating layer 280 provides for a gap between conductive layer 288 and encapsulant 198.

Figure 8E:
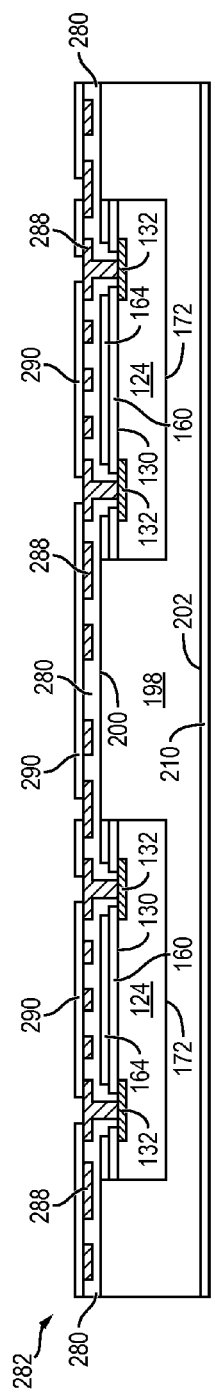

In FIG. 8e, an insulating or passivation layer 290 is formed over insulating layer 280 and conductive layer 288 using PVD, CVD, screen printing, spin coating, spray coating, sintering or thermal oxidation. Insulating layer 290 contains one or more layers of SiO2, Si3N4, SiON, Ta2O5, Al2O3, or other material having similar insulating and structural properties. Insulating layer 290 includes a surface opposite semiconductor die 124 that is substantially flat across reconstituted wafer 282. In one embodiment, insulating layer 290 includes an exclusion zone at the edge of reconstituted wafer 282 that is at least 0.5 µm wide. A portion of insulating layer 290 is removed by etching or LDA to expose conductive layer 288.

Figure 8F:
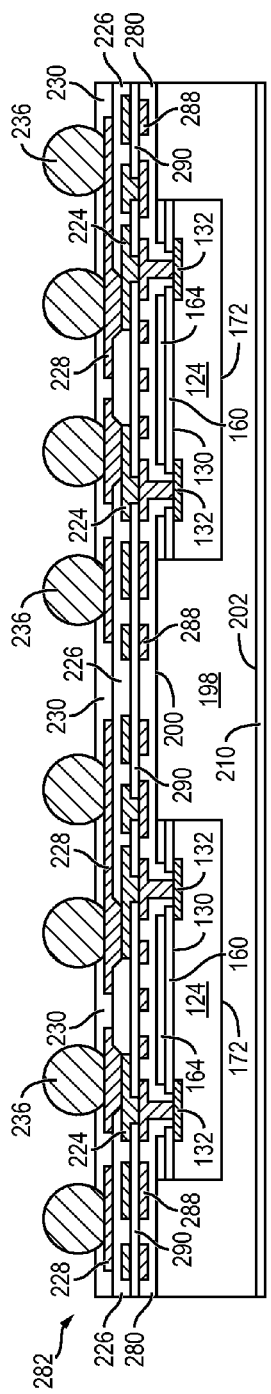

In FIG. 8f, the remainder of a build-up interconnect structure is formed over reconstituted wafer 282 in accordance with the embodiment in FIGS. 3l-3n. Reconstituted wafer 282 is singulated into individual eWLB.

FIGS. 9a-9c illustrate, in relation to FIGS. 8a-8f, a second alternative embodiment for forming an RDL with line-width or line-spacing less than 5 µm. The low pitch RDL structure described in FIGS. 9a-9c is formed on the embodiment for providing a recessed active surface 130 as shown in FIGS. 2d-2f and 3a-3d. However, the embodiments of FIGS. 5a-5d, FIGS. 6a-6d, or FIG. 7 are also compatible with the RDL layer as formed in FIGS. 9a-9c.

Continuing from FIG. 8a, FIG. 9a illustrates a portion of insulating layer 280 removed by LDA, etching, or other suitable process to form openings or vias 300 and trenches or RDL pattern 302. Trenches 302 are formed through insulating layer 280 to surface 200. In one embodiment, insulating layer 280 is a positive resist with vias 300 formed by a first exposure to UV light and trenches 302 formed by a second exposure to UV light. Vias 300 expose conductive layer 132 of semiconductor die 124 for subsequent electrical interconnect. In one embodiment, vias 300 and trenches 302 are formed using double patterning in order to provide for an RDL layer with sub 5 µm line-width or line-spacing. Other forms of multiple patterning are used in other embodiments.

In FIG. 9b, conductive layer 304 is formed using a similar process to conductive layer 288 in FIG. 8d. Portions of conductive layer 304 over conductive layer 132 have a similar shape in plan view as conductive layer 220 in FIGS. 3g-3k. An insulating or passivation layer 306 is formed over insulating layer 280 and conductive layer 304 using PVD, CVD, screen printing, spin coating, spray coating, sintering or thermal oxidation. Insulating layer 306 contains one or more layers of SiO2, Si3N4, SiON, Ta2O5, Al2O3, or other material having similar insulating and structural properties. Insulating layer 306 includes a surface opposite semiconductor die 124 that is substantially flat across reconstituted wafer 308. In one embodiment, insulating layer 306 includes an exclusion zone at the edge of reconstituted wafer 308 that is at least 0.5 µm wide. A portion of insulating layer 306 is removed by etching or LDA to expose conductive layer 304. No gap is present between conductive layer 304 and encapsulant 198.

In FIG. 9c, the remainder of a build-up interconnect structure is formed over reconstituted wafer 308 in accordance with the embodiment in FIGS. 3l-3n. Reconstituted wafer 308 is singulated into individual eWLB.

FIGS. 10a-10c illustrate, in relation to FIGS. 8a-8f, a third alternative embodiment for forming an RDL with line-width or line-spacing less than 5 µm. The low pitch RDL structure described in FIGS. 10a-10c is formed on the embodiment for providing a recessed active surface 130 as shown in FIGS. 2d-2f and 3a-3d. However, the embodiments of FIGS. 5a-5d, FIGS. 6a-6d, or FIG. 7 are also compatible with the RDL layer as formed in FIGS. 10a-10c.

Continuing from FIG. 8a, FIG. 10a illustrates a portion of insulating layer 280 removed by LDA, etching, or other suitable process to form trenches or RDL pattern 312. Trenches 312 are formed through insulating layer 280 to surface 200, insulating layer 160, and conductive layer 132. Insulating layer 280 is a positive resist with trenches 312 formed by a single exposure to UV light. Trenches 312 expose conductive layer 132 of semiconductor die 124 for subsequent electrical interconnect without a separately formed via. In one embodiment, trenches 312 are formed using double patterning in order to provide for an RDL layer with 5 µm line-width or line-spacing. Other forms of multiple patterning are used in other embodiments.

In FIG. 10b, conductive layer 314 is formed using a similar process to conductive layer 288 of FIG. 8d. Portions of conductive layer 314 over conductive layer 132 have a similar shape in plan view as conductive layer 220 in FIGS. 3g-3k, but conductive layer 314 includes a uniform cross-section through insulating layer 280. Conductive layer 314 has a larger contact area with conductive layer 132 than the contact area between conductive layer 220 and conductive layer 132. An insulating or passivation layer 316 is formed over insulating layer 280 and conductive layer 314 using PVD, CVD, screen printing, spin coating, spray coating, sintering or thermal oxidation. Insulating layer 316 contains one or more layers of SiO2, Si3N4, SiON, Ta2O5, Al2O3, or other material having similar insulating and structural properties. Insulating layer 316 includes a surface opposite semiconductor die 124 that is substantially flat across reconstituted wafer 318. In one embodiment, insulating layer 316 includes an exclusion zone at the edge of reconstituted wafer 318 that is at least 0.5 µm wide. A portion of insulating layer 316 is removed by etching or LDA to expose conductive layer 314. No gap is present between conductive layer 314 and encapsulant 198.

In FIG. 10c, the remainder of a build-up interconnect structure is formed over reconstituted wafer 318 in accordance with the embodiment in FIGS. 3l-3n. Reconstituted wafer 318 is singulated into individual eWLB.

Figure 11:
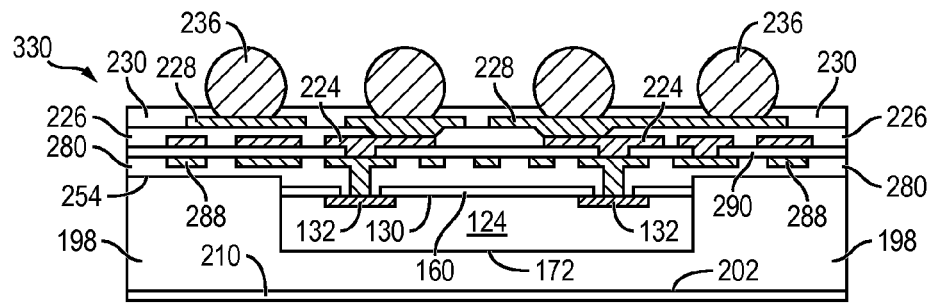
FIG. 11 illustrates a singulated eWLB formed in accordance with FIGS. 5a-5d and 8a-8f.

FIG. 11 illustrates a singulated eWLB 330 with an RDL layer including a line-width or line-spacing less than 5 µm. Active surface 130 of semiconductor die 124 is recessed within encapsulant 198. Backside layer 210 and insulating layer 280 reduce particles generated from encapsulant 198 during the formation of the build-up interconnect structure. The offset between active surface 130 of semiconductor die 124 and the surface of encapsulant 198 is provided as shown in FIGS. 5a-5d. A protective layer is formed over insulating layer 160 prior to encapsulation, and removed after the reconstituted wafer is formed but before insulating layer 280 is formed. Insulating layer 280, conductive layer 288, and insulating layer 290 are formed as shown in FIGS. 8a-8f, with a gap present between conductive layer 288 and encapsulant 198.

Figure 12:
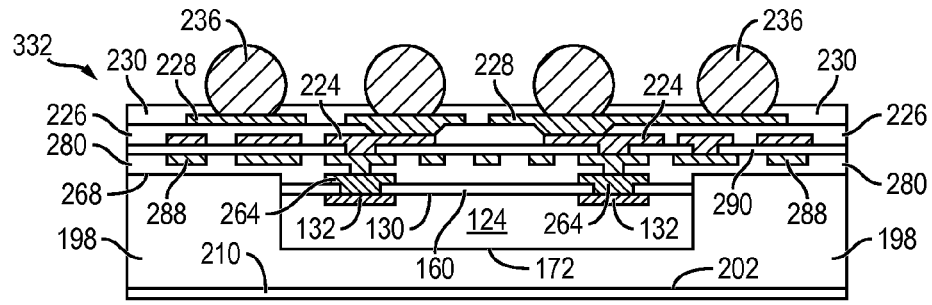
FIG. 12 illustrates a singulated eWLB formed in accordance with FIGS. 7 and 8a-8f.

FIG. 12 illustrates a singulated eWLB 332 with an RDL layer including a line-width or line-spacing less than 5 µm. Active surface 130 of semiconductor die 124 is recessed within encapsulant 198. Backside layer 210 and insulating layer 280 reduce particles generated from encapsulant 198 during the formation of the build-up interconnect structure.

The offset between active surface 130 of semiconductor die 124 and the surface of encapsulant 198 is provided as shown in FIGS. 6a-6d and 7. A plating resist is formed over insulating layer 160, and conductive layer 264 is formed, prior to encapsulation of semiconductor die 124. The plating resist layer is removed after the reconstituted wafer is formed but before insulating layer 280 is formed. Insulating layer 280, conductive layer 288, and insulating layer 290 are formed as shown in FIGS. 8a-8f, with a gap present between conductive layer 288 and encapsulant 198.

Figure 13:
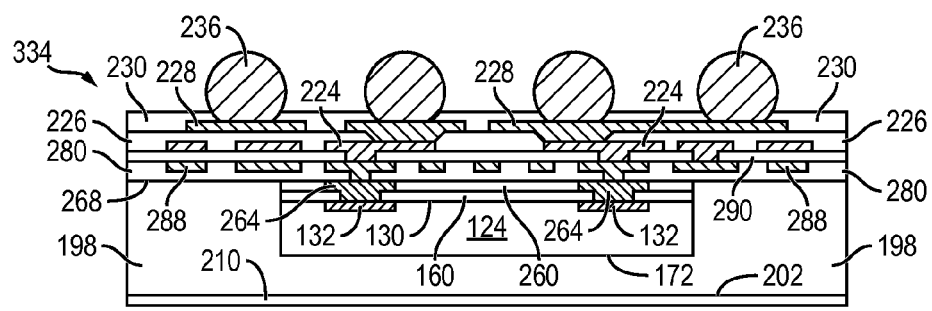
FIG. 13 illustrates a singulated eWLB formed in accordance with FIGS. 6a-6d and 8a-8f.

FIG. 13 illustrates a singulated eWLB 334 with an RDL layer including a line-width or line-spacing less than 5 μm. Active surface 130 of semiconductor die 124 is recessed within encapsulant 198. Backside layer 210 and insulating layer 280 reduce particles generated from encapsulant 198 during the formation of the build-up interconnect structure.

The offset between active surface 130 of semiconductor die 124 and the surface of encapsulant 198 is provided as shown in FIGS. 6a-6d. Insulating layer 260 is formed over insulating layer 160, and conductive layer 264 is formed, prior to encapsulation of semiconductor die 124. Insulating layer 260 is not removed, and insulating layer 280 is formed over encapsulant 198, insulating layer 260, and conductive layer 264. Insulating layer 280, conductive layer 288, and insulating layer 290 are formed as shown in FIGS. 8a-8f, with a gap present between conductive layer 288 and encapsulant 198.

Figure 14:
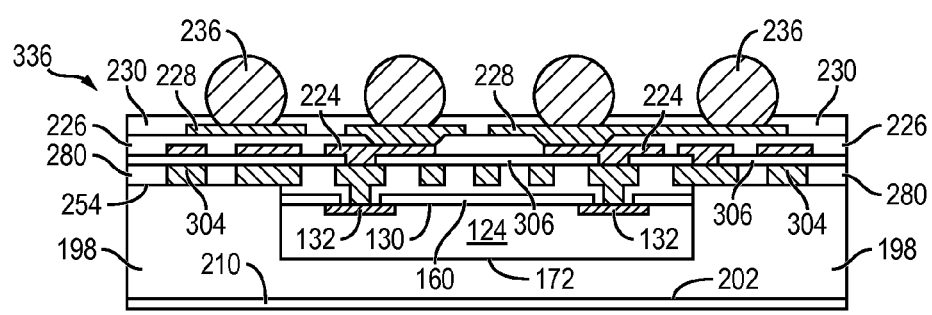
FIG. 14 illustrates a singulated eWLB formed in accordance with FIGS. 5a-5d and 9a-9c.

FIG. 14 illustrates a singulated eWLB 336 with an RDL layer including a line-width or line-spacing less than 5 μm. Active surface 130 of semiconductor die 124 is recessed within encapsulant 198. Backside layer 210 and insulating layer 280 reduce particles generated from encapsulant 198 during the formation of the build-up interconnect structure.

The offset between active surface 130 of semiconductor die 124 and the surface of encapsulant 198 is provided as shown in FIGS. 5a-5d. A protective layer is formed over insulating layer 160 prior to encapsulation, and removed after the reconstituted wafer is formed but before insulating layer 280 is formed. Insulating layer 280, conductive layer 304, and insulating layer 306 are formed as shown in FIGS. 9a-9c, and no gap is present between conductive layer 304 and encapsulant 198.

Figure 15D:
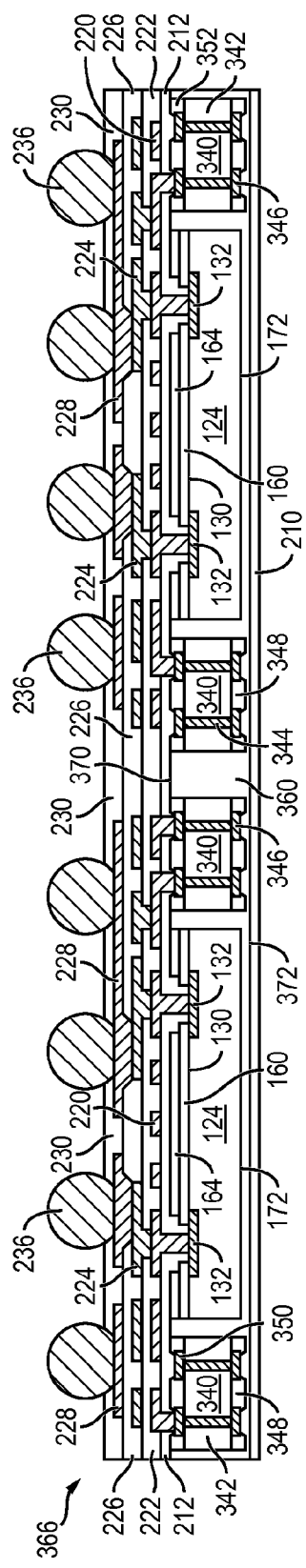

FIGS. 15a-15e illustrate, in relation to FIGS. 3a-3o, a process of forming an eWLB with an RDL layer including a line-width or line-spacing less than 5 μm and with embedded 3D interconnect components. FIG. 15a shows a cross-sectional view of a portion of carrier 190 and interface layer 192 with semiconductor die 124 mounted on the interface layer as in FIG. 3b. A plurality of 3D interconnect components 340 are mounted to carrier 190 adjacent to semiconductor die 124. The plurality of 3D interconnect components 340 and semiconductor die 124 can be mounted on carrier 190 in any order.

3D interconnect component or interposer 340 is prefabricated, i.e., interposer 340 is formed prior to mounting interposer 340 to carrier 190. Interposer 340 includes a core substrate 342. Substrate 342 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. In one embodiment, substrate 342 is a composite with woven fiber and filler. Alternatively, core substrate 342 includes one or more insulating or passivation layers.

A plurality of through vias is formed through core substrate 342 using laser drilling, mechanical drilling, or deep reactive ion etching (DRIE). The vias are filled with Al, Cu, Sn, Ni, Au, Ag, Ti, W, or other suitable electrically conductive material using electrolytic plating, electroless plating, or other suitable deposition process to form z-direction vertical interconnect conductive vias 344. In one embodiment, Cu is deposited over the sidewall of the through vias by electroless plating and electroplating. The through vias are filled with conductive paste or plugging resin with fillers.

An electrically conductive layer or RDL 346 is formed over the surface of core substrate 342 and conductive vias 344 using a patterning and metal deposition process such as printing, PVD, CVD, sputtering, electrolytic plating, or electroless plating. Conductive layer 346 includes one or more layers of Al, Cu, Sn, Ni, Au, Ag, or other suitable electrically conductive material. Conductive layer 346 is electrically connected to conductive vias 344. Conductive layer 346 operates as contact pads electrically connected to conductive vias 344.

An insulating or passivation layer 348 is formed over the surface of core substrate 342 and conductive layer 346 using PVD, CVD, printing, spin coating, spray coating, slit coating, rolling coating, lamination, sintering, or thermal oxidation. Insulating layer 348 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 348 is removed by LDA, etching, or other suitable process to expose portions of conductive layer 346. In one embodiment, insulating layer 348 is a masking layer.

An electrically conductive layer or RDL 350 is formed over a surface of core substrate 342 opposite conductive layer 346 using a patterning and metal deposition process such as printing, PVD, CVD, sputtering, electrolytic plating, or electroless plating. Conductive layer 350 includes one or more layers of Al, Cu, Sn, Ni, Au, Ag, or other suitable electrically conductive material. Conductive layer 350 is electrically connected to conductive vias 344 and conductive layer 346. Conductive layer 350 operates as contact pads electrically connected to conductive vias 344. Alternatively, conductive vias 344 are formed through core substrate 342 after forming conductive layer 346 and/or conductive layer 350.

An insulating or passivation layer 352 is formed over the surface of core substrate 342 and conductive layer 350 using PVD, CVD, printing, spin coating, spray coating, slit coating, rolling coating, lamination, sintering, or thermal oxidation. Insulating layer 352 includes one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 352 is removed by LDA, etching, or other suitable process to expose portions of conductive layer 350. In one embodiment, insulating layer 352 is a masking layer. Substrate 342 is then singulated into individual 3D interconnect components or interposers 340. Interposer 340 is known good having been inspected and tested by an open/short probe or an auto-scope inspection at an interim stage, i.e., prior to mounting on carrier 190.

In FIG. 15b, an encapsulant or molding compound 360 is deposited over semiconductor die 124, interposers 340, and carrier 190 as an insulating material using a paste printing, compressive molding, transfer molding, liquid encapsulant molding, vacuum lamination, spin coating, or other suitable applicator. Encapsulant 360 is similar to encapsulant 198 in FIG. 3c. In particular, encapsulant 360 covers the side surfaces and surface 172 of semiconductor die 124. Encapsulant 360 can be polymer composite material, such as epoxy resin with filler, epoxy acrylate with filler, or polymer with proper filler. Encapsulant 360 is non-conductive and environmentally protects the semiconductor device from external elements and contaminants. Encapsulant 360 also protects semiconductor die 124 from degradation due to exposure to light. Reconstituted wafer 366 with encapsulant 360 includes surface 370 and surface 372.

In FIG. 15c, carrier 190 and interface layer 192 are removed by chemical etching, mechanical peeling, CMP, mechanical grinding, thermal bake, UV light, laser scanning, or wet stripping to expose insulating layer 164, insulating layer 160, conductive layer 132, conductive layer 350, and insulating layer 352. Surface 172 of semiconductor die 124, as well as the sides of the semiconductor die, remain covered by encapsulant 360 as a protective panel to increase yield, particularly when surface mounting the semiconductor die. After carrier 190 and interface layer 192 are removed, an optional edge rounding process is performed on reconstituted wafer 366. An optional back grinding process is performed on encapsulant 360 to tune the warpage of reconstituted wafer 366 and provide a more uniform thickness of the reconstituted wafer. The optional back grinding process is done with back grinding tape or without back grinding tape.

Next, backside layer 210 is formed over surface 372 of reconstituted wafer 366 using PVD, CVD, printing, lamination, spin coating, or spray coating. Backside layer 210 is a particle prevention layer, and contains one or more layers of SiO2, Si3N4, SiON, Ta2O5, Al2O3, polymer thin film, cured polymer without filler, metal thin film or foil, Si, or other material which will function to reduce particle generation from surface 372 during subsequent processing steps of reconstituted wafer 366. A material with a higher resistance to wear than encapsulant 360 is used for backside layer 210 so that backside layer 210 generates fewer particles than encapsulant 360 would without backside layer 210. The presence of backside layer 210 reduces the amount of particles generated from encapsulant 360 during subsequent processing steps of reconstituted wafer 366.

Reconstituted wafer 366 undergoes a grinding or polishing operation on surface 370 using a grinder or other suitable mechanical or etching process. In some embodiments, an optional back grinding tape is applied over surface 372 and backside layer 210 during the grinding or polishing operation. The grinding operation partially removes insulating layer 164. In some embodiments where a higher quality polishing is required, an additional slurry polishing is performed on surface 370 of reconstituted wafer 366. Insulating layer 164 acts as a partial planarization layer and a polishing stop layer. A portion of insulating layer 164 remains over insulating layer 160 after the grinding operation. A surface of encapsulant 360 is coplanar with a surface of insulating layer 164 to form surface 370 of reconstituted wafer 366. Insulating layer 160 is recessed within reconstituted wafer 366. A cavity embedded die approach is used, which results in active surface 130 of semiconductor die 124 recessed within reconstituted wafer 366. Active surface 130 is protected during subsequent processing steps by being offset from surface 370, and covered by insulating layers 160 and 164. While the embodiment for providing for a cavity embedded die from FIGS. 2d-2f and 3a-3d is illustrated, any of the other embodiments, illustrated in FIGS. 5a-5d, 6a-6d, or 7, can be used.

In FIG. 15d, a build-up interconnect structure is formed as illustrated in FIGS. 3e-3n. Conductive layer 220 makes electrical contact with conductive layer 350 as required depending on the design and function of semiconductor die 124. While the embodiment for forming a sub 5 μm RDL layer from FIGS. 3e-3f is illustrated, the embodiments from FIGS. 8a-8f, 9a-9c, or 10a-10c can also be used with reconstituted wafer 366.

Figure 15E:
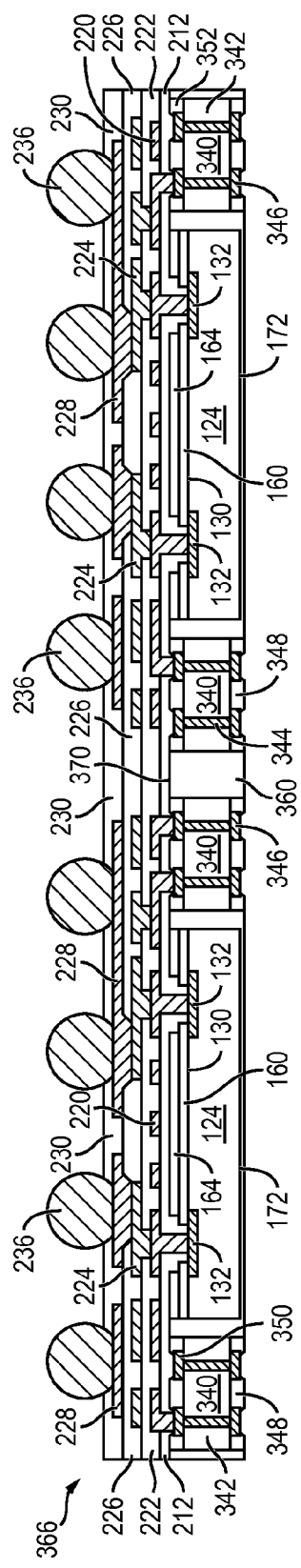

In FIG. 15e, surface 372 of reconstituted wafer 366 undergoes a grinding or polishing operation to reach a target thickness of reconstituted wafer 366. Conductive layer 346 is exposed by the grinding or polishing operation, or by a separate LDA or etching process. While backside layer 210 is removed and no longer provides a reduction in particles generated by encapsulant 360, the sub 5 μm RDL layer, i.e., conductive layer 220, is already formed and is protected by the subsequent RDL layers from particles generated by encapsulant 360. In one embodiment, backside layer 210 is not removed, and conductive vias are formed through the backside layer and encapsulant 360 to provide electrical connection to conductive layer 346 of interposer 340. Reconstituted wafer 366 is singulated into individual eWLB.

Figure 16A:
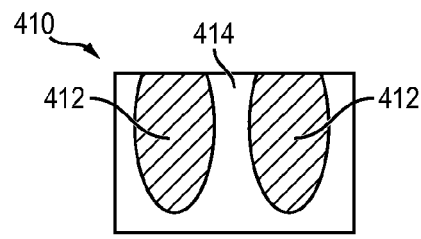
FIGS. 16a-16d illustrate alternative 3D interconnect components for use with the embodiment in FIGS. 15a-15e.
Figure 16B:
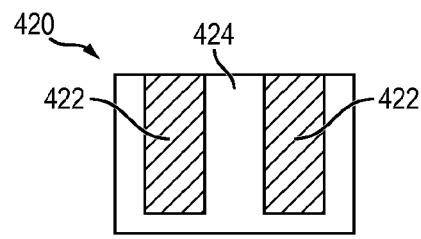
Figure 16C:
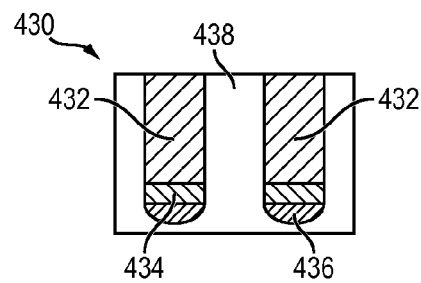

FIGS. 16a-16c illustrate 3D interconnect components that are used in other embodiments instead of or in addition to interposer 340 in FIGS. 15a-15e. FIG. 16a illustrates 3D interconnect component 410 including conductive bumps 412 within encapsulant or substrate 414. Bumps 412 are formed from Al, Cu, Sn, Ni, Au, Ag, Ti, W, Pb, Bi, solder or other suitable electrically conductive material on a substrate using electrolytic plating, electroless plating, or other suitable deposition process to form bumps 412. Encapsulant 414 is deposited over the substrate and bumps 412 as an insulating material using a paste printing, compressive molding, transfer molding, liquid encapsulant molding, vacuum lamination, spin coating, or other suitable applicator. Encapsulant 414 can be polymer composite material, such as epoxy resin with filler, epoxy acrylate with filler, polymer with proper filler, or a composite with woven fibers and filler. Encapsulant 414 is similar to encapsulant 360, and is formed from the same material, or a different material, than encapsulant 360.

In one embodiment, individual 3D interconnect components 410 are singulated from a structure including many bumps 412 covered in encapsulant 414. In another embodiment, conductive balls are covered in encapsulant 414, and the encapsulant is grinded to expose the conductive balls and create a planar surface through the balls to create bumps 412. In yet another embodiment, encapsulant 414 is formed as a substrate, and an LDA or etching process forms openings in encapsulant 414 in the shape desired for bumps 412. The openings in encapsulant 414 are filled with Al, Cu, Sn, Ni, Au, Ag, Ti, W, or other suitable electrically conductive material using electrolytic plating, electroless plating, or other suitable deposition process to form bumps 412. 3D interconnect component 410 is used similarly to interposer 340.

FIG. 16b illustrates 3D interconnect component 420 including conductive pillars 422 within encapsulant or substrate 424. Pillars 422 are formed from Al, Cu, Sn, Ni, Au, Ag, Ti, W, or other suitable electrically conductive material on a substrate using electrolytic plating, electroless plating, or other suitable deposition process to form pillars 422. Encapsulant 424 is deposited over the substrate and pillars 422 as an insulating material using a paste printing, compressive molding, transfer molding, liquid encapsulant molding, vacuum lamination, spin coating, or other suitable applicator. Encapsulant 424 can be polymer composite material, such as epoxy resin with filler, epoxy acrylate with filler, polymer with proper filler, or a composite with woven fibers and filler. Encapsulant 424 is similar to encapsulant 360, and is formed from the same material, or a different material, than encapsulant 360.

In one embodiment, individual 3D interconnect components 420 are singulated from a structure including many pillars 422 covered in encapsulant 424. In another embodiment, encapsulant 424 is formed as a substrate, and an LDA or etching process forms openings in encapsulant 424 in the shape desired for pillars 422. The openings in encapsulant 424 are filled with Al, Cu, Sn, Ni, Au, Ag, Ti, W, or other suitable electrically conductive material using electrolytic plating, electroless plating, or other suitable deposition process to form pillars 422. 3D interconnect component 420 is used similarly to interposer 340.

FIG. 16c illustrates 3D interconnect component 430 including conductive pillars 432 with conductive layer 434 and bumps 436 within encapsulant or substrate 438. Pillars 432 are formed from Al, Cu, Sn, Ni, Au, Ag, Ti, W, or other suitable electrically conductive material on a substrate using electrolytic plating, electroless plating, or other suitable deposition process. Conductive layer 434 is formed from Al, Cu, Sn, Ni, Au, Ag, Ti, W, or other suitable electrically conductive material on a substrate using electrolytic plating, electroless plating, or other suitable deposition process. An electrically conductive bump material is deposited over conductive layer 434 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 434 using a suitable attachment or bonding process. In one embodiment, the bump material is reflowed by heating the material above its melting point to form balls or bumps 436. In some applications, bumps 436 are reflowed a second time to improve electrical contact to conductive layer 434. In one embodiment pillars 432 are formed from Cu, conductive layer 434 is formed from plated Ni, and bumps 436 are formed from plated solder.

Encapsulant 438 is deposited over the substrate and pillars 432, conductive layer 434, and bumps 436 as an insulating material using a paste printing, compressive molding, transfer molding, liquid encapsulant molding, vacuum lamination, spin coating, or other suitable applicator. Encapsulant 438 can be polymer composite material, such as epoxy resin with filler, epoxy acrylate with filler, polymer with proper filler, or a composite with woven fibers and filler. Encapsulant 438 is similar to encapsulant 360, and is formed from the same material, or a different material, than encapsulant 360.

In one embodiment, individual 3D interconnect components 430 are singulated from a structure including many pillars 432 covered in encapsulant 438. In another embodiment, encapsulant 438 is formed as a substrate, and an LDA or etching process forms openings in encapsulant 438 in the shape desired for pillars 432, conductive layer 434, and bumps 436. Bumps 436, conductive layer 434, and pillars 432 are formed in the opening in encapsulant 438. 3D interconnect component 430 is used similarly to interposer 340.

Figure 16D:
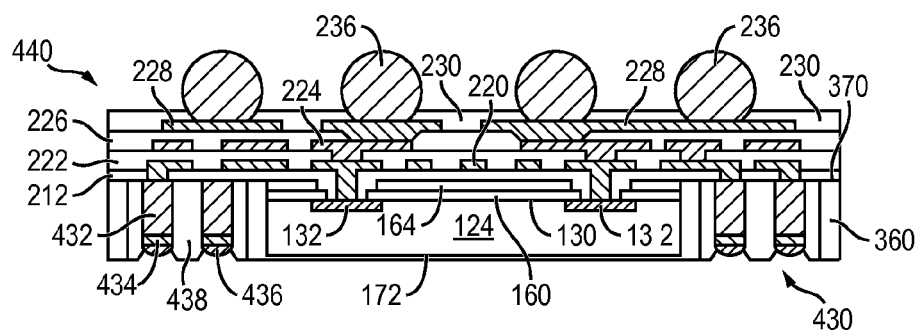

FIG. 16d illustrates eWLB 440 after singulation. eWLB 440 is formed in a similar process to reconstituted wafer 366 in FIGS. 15a-15e, followed by singulation using a laser cutting tool or saw blade. eWLB 440 is formed using 3D interconnect structures 430 instead of interposer 340 in reconstituted wafer 366. However, 3D interconnect structures 410 or 420, or a combination of interposer 340 and 3D interconnect structures 410, 420, and 430 can be used. Conductive layer 220 is electrically connected to pillars 432, conductive layer 434, and bumps 436 through openings in insulating layer 212. A portion of encapsulant 438 is removed using an etching or LDA process to expose bumps 436 for subsequent interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a plurality of semiconductor die as a semiconductor wafer;
forming a third insulating layer over an active surface of the semiconductor wafer;
forming a third opening in the third insulating layer, wherein the third opening is elongated in a first direction parallel to the active surface of the semiconductor wafer such that a length of the third opening is greater than a width of the third opening and the length and width of the third opening are both parallel to the active surface of the semiconductor wafer;
forming a fourth insulating layer over the semiconductor wafer and third insulating layer;
forming a fourth opening in the fourth insulating layer aligned with the third opening in the third insulating layer, wherein the fourth opening is elongated in a second direction substantially perpendicular to the first direction and parallel to both the width of the third opening and the active surface such that the fourth opening extends outside a footprint of the third opening and the third opening extends outside a footprint of the fourth opening;
singulating the plurality of semiconductor die from the semiconductor wafer after forming the third insulating layer, third opening, fourth insulating layer, and fourth opening;
disposing the plurality of semiconductor die on a carrier with the third insulating layer and fourth insulating layer oriented toward the carrier;
depositing an encapsulant over the carrier and plurality of semiconductor die to cover a back surface of the plurality of semiconductor die opposite the active surface, wherein a first surface of the encapsulant is coplanar with a surface of the fourth insulating layer opposite the semiconductor die;
forming a backside insulating layer over a second surface of the encapsulant opposite the first surface of the encapsulant while the semiconductor die and encapsulant remain on the carrier, wherein the backside insulating layer includes a higher resistance to wear than the encapsulant and a portion of the encapsulant extends between the backside insulating layer and the back surface of the plurality of semiconductor die;
removing the carrier after forming the backside insulating layer;
forming a first insulating layer over the first surface of the encapsulant and the active surface of the plurality of semiconductor die after forming the backside insulating layer, wherein the first insulating layer extends into the third opening of the third insulating layer and the fourth opening of the fourth insulating layer;
forming a first opening in the first insulating layer aligned with the third opening of the third insulating layer and the fourth opening of the fourth insulating layer, wherein a footprint of the first opening is completely within the footprint of the third opening and the footprint of the fourth opening;
forming a conductive layer over the first insulating layer and extending into the first opening in the first insulating layer to contact the semiconductor die, wherein the first insulating layer creates a physical separation between the conductive layer and the third insulating layer; and
singulating through the encapsulant and backside insulating layer, thereby separating each of the plurality of semiconductor die into individual packages.

2. The method of claim 1, further including forming the conductive layer to include a line-pitch or line-spacing of less than 5 μm.

3. The method of claim 1, further including:
disposing an interconnect component adjacent to one of the plurality of semiconductor die; and
depositing the encapsulant over the plurality of semiconductor die and interconnect component.

4. The method of claim 1, further including:
forming a trench in the first insulating layer;
forming the conductive layer in the trench; and
planarizing the first insulating layer and conductive layer using a grinding or polishing operation.

5. The method of claim 1, further including:
disposing a 3D interconnect unit on the carrier; and
depositing the encapsulant over the semiconductor die and 3D interconnect unit.

6. The method of claim 1, further including forming the conductive layer to include a contact pad directly over the first opening, third opening, and fourth opening, wherein the contact pad is elongated in the first direction.

7. The method of claim 1, wherein a portion of the third insulating layer is exposed in the fourth opening and a portion of the fourth insulating layer contacts a contact pad of the semiconductor wafer within the third opening.

8. A method of making a semiconductor device, comprising:
providing a semiconductor die;
forming a first insulating layer over an active surface of the semiconductor die including a first opening through the first insulating layer elongated in a first direction parallel to the active surface of the semiconductor die;
forming a second insulating layer over the active surface of the semiconductor die including a second opening through the second insulating layer elongated in a second direction, wherein the second direction is substantially perpendicular to the first direction and parallel to the active surface of the semiconductor die;
disposing the semiconductor die on a carrier with the first insulating layer and second insulating layer oriented toward the carrier;
depositing an encapsulant over the semiconductor die and carrier with a back surface of the encapsulant extending over a back surface of the semiconductor die;
forming a backside insulating layer over the back surface of the semiconductor die while the semiconductor die and encapsulant remain on the carrier, wherein the backside insulating layer includes a greater resistance to wear than the encapsulant;
forming a third insulating layer over the encapsulant, first insulating layer, and second insulating layer, wherein the third insulating layer extends into the first opening and second opening;
forming a third opening in the third insulating layer, wherein a footprint of the third opening is completely within a footprint of the first opening and a footprint of the second opening; and
forming a conductive layer over the third insulating layer and into the third opening of the third insulating layer after depositing the encapsulant.

9. The method of claim 8, further including:
disposing an interconnect component adjacent to the semiconductor die; and
depositing the encapsulant over the semiconductor die and interconnect component.

10. The method of claim 8, further including forming the conductive layer to include a line-pitch or line-spacing of less than 5 μm.

11. The method of claim 8, wherein the active surface of the semiconductor die is recessed within the encapsulant.

12. The method of claim 8, further including forming the backside insulating layer prior to forming the conductive layer.

13. The method of claim 8, further including:
forming a trench in the third insulating layer;
forming the conductive layer in the trench; and
planarizing the third insulating layer and conductive layer.

14. A method of making a semiconductor device, comprising:
providing a semiconductor die;
forming a first insulating layer over an active surface of the semiconductor die including a first opening through the first insulating layer;
forming a second insulating layer over the active surface of the semiconductor die including a second opening through the second insulating layer extending into the first opening, wherein a first portion of a perimeter of the second opening is within a footprint of the first opening and a second portion of the perimeter of the second opening is outside a footprint of the first opening;
disposing the semiconductor die on a carrier;
depositing an encapsulant over the semiconductor die and carrier with an active surface of the semiconductor die recessed in the encapsulant, a first surface of the encapsulant extending over a back surface of the semiconductor die, and a second surface of the encapsulant that is coplanar with the second insulating layer;
depositing a backside insulating layer onto the encapsulant to cover substantially all of the first surface of the encapsulant while the semiconductor die remains on the carrier;
forming a third insulating layer over the second surface of the encapsulant opposite the first surface of the encapsulant while the backside insulating layer remains covering substantially all of the first surface of the encapsulant; and
forming a third opening through the third insulating layer, wherein a footprint of the third opening is completely within a footprint of the first opening.

15. The method of claim 14, further including forming a conductive layer over the semiconductor die.

16. The method of claim 15, further including forming the backside insulating layer and third insulating layer prior to forming the conductive layer.

17. The method of claim 15, further including forming the conductive layer to include a line-pitch or line-spacing of less than 5 µm.

18. The method of claim 15, further including forming the conductive layer in the third opening without the conductive layer contacting the first insulating layer.

19. The method of claim 14, further including forming the first opening, second opening, and third opening directly over a contact pad on the semiconductor die.

20. The method of claim 14, wherein the backside insulating layer includes a resistance to wear greater than a resistance to wear of the encapsulant.

21. The method of claim 19, wherein the third opening exposes the contact pad without exposing the first insulating layer and without exposing the second insulating layer.

22. A method of making a semiconductor device, comprising:
providing a semiconductor die;
forming a first insulating layer over an active surface of the semiconductor die including a first opening through the first insulating layer;
forming a second insulating layer over the active surface of the semiconductor die including a second opening through the second insulating layer, wherein a first portion of a perimeter of the second opening is within a footprint of the first opening and a second portion of the perimeter of the second opening is outside a footprint of the first opening;
disposing the semiconductor die on a carrier with the first insulating layer and second insulating layer oriented toward the carrier;
depositing an encapsulant over a first surface of the semiconductor die opposite the active surface with a first surface of the encapsulant over and parallel to the first surface of the semiconductor die, wherein the semiconductor die remains on the carrier while depositing the encapsulant; and
depositing a backside insulating layer onto the encapsulant and covering substantially an entirety of the first surface of the encapsulant while the semiconductor die and encapsulant remain on the carrier.

23. The method of claim 22, further including:
disposing an interconnect component adjacent to the semiconductor die; and
depositing the encapsulant over the semiconductor die and interconnect component.

24. The method of claim 22, further including forming an interconnect structure over the active surface of the semiconductor die while the backside insulating layer remains covering substantially the entirety of the first surface of the encapsulant.

25. The method of claim 24, further including:
forming the second insulating layer prior to depositing the encapsulant;
forming the second opening after depositing the first insulating layer; and
forming the interconnect structure extending into the second opening.

\* \* \* \* \*